(12) United States Patent
Tabuchi

(10) Patent No.: US 6,398,042 B1
(45) Date of Patent: Jun. 4, 2002

(54) SUBSTRATE MOUNTING APPARATUS

(75) Inventor: Hiroshi Tabuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/684,617

(22) Filed: Oct. 10, 2000

(30) Foreign Application Priority Data

Mar. 30, 2000 (JP) ......................................... 2000-094517

(51) Int. Cl.[7] .............................................. A47G 19/08
(52) U.S. Cl. ................................................ 211/41.17
(58) Field of Search ............................... 211/41.17, 26; 361/796

(56) References Cited

U.S. PATENT DOCUMENTS

| | | | | |
|---|---|---|---|---|
| 3,664,510 A | * | 5/1972 | Kerschbaum | |
| 3,714,513 A | * | 1/1973 | Marconi | |
| 4,214,292 A | * | 7/1980 | Johnson | |
| 4,779,744 A | * | 10/1988 | Shely et al. | |
| 5,044,506 A | * | 9/1991 | Brown | |
| 6,288,902 B1 | * | 9/2001 | Kim et al. | |

FOREIGN PATENT DOCUMENTS

| | | |
|---|---|---|
| JP | 7-162170 | 6/1995 |
| JP | 11-238981 | 8/1999 |

* cited by examiner

*Primary Examiner*—Alvin Chin-Shue
*Assistant Examiner*—Sarah Purol
(74) *Attorney, Agent, or Firm*—Oblon, Spivak, McClelland, Maier & Neustadt, P.C.

(57) ABSTRACT

There is provided an electronic circuit unit frame 1, an upper guide rail 6 having an upper guide groove 6a and supported vertically movably on an upper face portion of the electronic circuit unit frame 1, a lower guide rail 7 having a lower guide groove portion 7a and fixed to a bottom face portion of the electronic circuit unit frame 1 with a predetermined space F formed together with the upper guide rail 6, and space holding means 9 formed integrally with the upper and lower guide rails 6 and 7 for holding the predetermined space F.

12 Claims, 15 Drawing Sheets

P DIRECTION OF DEFLECTION

P DIRECTION OF DEFLECTION

SUBSTRATE MOUNTING APPARATUS

BACKGROUND OF THE INVENTION

The present invention relates to a substrate mounting apparatus for mounting a substrate on which electronic parts are provided, and to a substrate mounting apparatus capable of surely supporting a substrate even if an electronic circuit unit frame for accommodating the substrate is deflected by the weight of the substrate, for example.

FIG. 14 is a sectional side view showing a part of a conventional substrate mounting apparatus disclosed in the Unexamined Japanese Patent Application Publication No. Hei 11-238981, for example. In FIG. 14, the reference numeral 20 denotes a removable substrate which is plate-shaped, is provided with a printed wiring (not shown) and has a plurality of electronic parts (not shown) mounted thereon. The reference numeral 21 denotes an electronic circuit unit frame (which will be hereinafter referred to as a shelf) for accommodating the substrate 20 in a predetermined mounting position, in which the substrate 20 is inserted in an insertion direction A through a substrate insertion port on the left side in the drawing. The reference numeral 22 denotes a spring having one of ends fixed to a groove portion 21a provided on the upper face portion side of the shelf 21.

The reference numeral 23 denotes an upper guide rail having an upper guide groove 23a fixed to an internal side wall on the upper face portion side of the shelf 21 and opened on the lower side. The upper guide groove 23a is formed by a groove bottom portion 23b and groove side walls 23c and 2d. The groove bottom portion 23b is supported vertically movably through the groove side walls 23c and 23d and is fixed to the other end of the spring 22. The reference numeral 24 is a lower guide rail which has a lower guide groove 24a opened on the upper side and is fixed to a bottom face portion of the shelf 21. The reference numeral 24b denotes a dent portion provided on a bottom face of the lower guide groove 24a, and the reference numeral 24c denotes a projection provided on the bottom face of the lower guide groove 24a. The reference numeral 25 denotes a backboard substrate to be a connecting portion to which the substrate 20 is connected. When the substrate 20 is accommodated in the shelf 21, a connector 25a and a connector 20a of the substrate 20 are connected to each other.

Next, an operation will be described with reference to the drawings. When the substrate 20 is to be mounted, upper and lower side edge portions of the substrate 20 are inserted into the upper and lower guide grooves 23a and 24a respectively so that the substrate 20 is moved toward the mounting direction A side. At this time, the projection 24c of the lower guide rail 24 abuts on a lower end of the substrate 20, and the bottom face of the lower guide groove 24a of the lower guide rail 24 abuts on the projection 20b of the substrate 20. Consequently, in the state in which the substrate 20 is shifted more upward as compared with the time that the insertion is completed, only the groove bottom portion 23b of the upper guide rail 23 is pushed upward against the force of the spring 22 energizing the spring force in an extension direction.

When the substrate 20 is further slid in the insertion direction A in this state, the projection 20b of the substrate 20 is fitted in the dent portion 24b and the projection 24c is fitted in the dent portion 20c of the substrate 20. At the same time, the connector 25a is connected to the connector 20a of the substrate 20. Thus, the substrate 20 is completely mounted. When the mounting operation is completed, the upper and lower positions of the bottom portion 23b of the upper guide groove 23a are placed in lower parts as compared with the middle of the insertion of the substrate 20. Also in that state, the spring 22 energizes the bottom portion 23b downward by some force.

Thus, the dent 20b and the projection 20c of the substrate 20 are fitted in the dent 24b and the projection 24c of the lower guide rail portion 24 respectively, and the spring 22 energizes the substrate 20 downward through the bottom portion 23b. Therefore, the substrate 20 is supported by the upper guide rail portion 23 and the lower guide rail portion 24. Accordingly, even if a vibration is applied from the outside, it is possible to prevent the substrate 20 from being moved toward the discharge direction B side and slipping down.

Since the conventional substrate mounting apparatus has the above-mentioned structure, the substrate 20 can be prevented from moving toward the discharge direction B side but cannot fully be prevented from falling down in a lateral direction. More specifically, when a plurality of substrates 20 are mounted on the shelf 21, the bottom portion side of the shelf 21 is deflected downward by the weight of the substrates 20 as shown in FIG. 15. In some cases in which the substrate mounting apparatus is to be installed in a higher position (not shown) or an adjusting work is to be carried out, some of the substrates 20 are supported on the upper and lower guide rails 23 and 24 and the connector 20a is not connected to the connector 25a. In such a state, structural reinforcement by the connection between the connectors is reduced so that the amount of deflection is increased. If the amount of deflection is greater than the heights of the side walls 23b and 23c of the upper guide groove 23a, the substrate 20 gets out of the upper guide groove 23a of the upper guide rail 23 and falls down in the lateral direction. There is a problem in that electronic parts provided on the falling substrate 20 or electronic parts provided on the adjacent substrates 20 are damaged.

SUMMARY OF THE INVENTION

The present invention has been made to solve the above-mentioned problem and has an object to provide a substrate mounting apparatus in which mounted substrates neither fall down nor slip down and are not damaged even if the number of substrates to be mounted on a shelf is increased and the amount of deflection of a bottom plate of the shelf becomes larger.

In order to eliminate the above-mentioned drawbacks, the present invention provides a substrate mounting apparatus comprising an electronic circuit unit frame for accommodating a removable substrate provided with electronic parts in a predetermined mounting position, an upper guide rail having an upper guide groove provided from a substrate insertion port of the electronic circuit unit frame to the vicinity of the mounting position and supported vertically movably on an upper face portion of the electronic circuit unit frame, a lower guide rail having a lower guide groove portion provided from the substrate insertion port to the vicinity of the mounting position and fixed to a bottom face portion of the electronic circuit unit frame with a predetermined space formed together with the upper guide rail, and space holding means formed integrally with the upper and lower guide rails for holding the predetermined space.

In the substrate mounting apparatus according to the present invention, moreover, the space holding means is a bar-shaped member formed integrally with the upper and lower guide rails on respective rear ends of the upper and lower guide rails on an insertion terminating side of the substrate.

In the substrate mounting apparatus according to the present invention, furthermore, the upper guide groove of the upper guide rail is opened on a substrate insertion port side of the electronic circuit unit frame and a lower side, the lower guide groove of the lower guide rail is opened on the substrate insertion port side and an upper side and the upper and lower guide grooves are provided with a slant portion such that the substrate insertion port side is widened.

The present invention provides a substrate mounting apparatus comprising an electronic circuit unit frame for accommodating a removable substrate provided with electronic parts in a predetermined mounting position, a lower guide rail having a lower guide groove provided from a substrate insertion port of the electronic circuit unit frame to the vicinity of the mounting position and fixed to a bottom face portion of the electronic circuit unit frame, and an upper guide rail having an upper guide groove provided from the substrate insertion port to the vicinity of the mounting position and supported on an upper face portion of the electronic circuit unit frame movably toward the lower guide rail side in a lower part by a self-weight, wherein a groove side wall of the upper guide groove is formed integrally with the upper guide rail and is moved together with the upper guide rail.

In the substrate mounting apparatus according to the present invention, moreover, the upper guide rail has a substrate insertion port side and a substrate insertion terminating side supported vertically movably on the upper face portion of the electronic circuit unit frame.

In the substrate mounting apparatus according to the present invention, furthermore, the upper guide rail has one of the substrate insertion port side and the substrate insertion terminating side supported rotatably on the upper face portion of the electronic circuit unit frame and the other formed arcuately movably toward the lower guide rail side.

The present invention provides a substrate mounting apparatus comprising an electronic circuit unit frame for accommodating a removable substrate provided with electronic parts in a predetermined mounting position, a connecting portion positioned in the vicinity of an internal side wall of the electronic circuit unit frame facing in an insertion direction of the substrate to form the mounting position and causing the substrate to be removably mounted thereon, an upper guide rail having an upper guide groove provided from a substrate insertion port of the electronic circuit unit frame to the vicinity of the mounting position and provided in an upper face portion of the electronic circuit unit frame, a lower guide rail having a lower guide groove portion provided from the substrate insertion port to the vicinity of the mounting position and provided in a bottom face portion of the electronic circuit unit frame, and energizing means for energizing one of the upper and lower guide rails toward the other, wherein one of the upper and lower guide rails which is energized by the energizing means is supported vertically movably on the electronic circuit unit frame and formed movably together with a groove side wall of the guide groove laterally supporting an edge portion of the substrate and the upper and lower guide rails are provided to have a predetermined distance with the connecting portion.

In the substrate mounting apparatus according to the present invention, the upper guide rail is supported on the upper face portion of the electronic circuit unit frame to be movable toward the lower guide rail side in a lower part, the lower guide rail is fixed to the bottom face portion of the electronic circuit unit frame, and the energizing means is a first spring member engaged with the upper guide rail and the upper face portion for energizing the upper guide rail toward the lower guide rail side.

In the substrate mounting apparatus according to the present invention, the upper guide rail has one of front and rear ends supported rotatably on the upper face portion of the electronic circuit unit frame and the other formed arcuately movably toward the lower guide rail side.

In the substrate mounting apparatus according to the present invention, the upper guide rail is fixed to the upper face portion of the electronic circuit unit frame, the lower guide rail is supported on the bottom face portion of the electronic circuit unit frame movably toward the upper guide rail side in an upper part, and the energizing means is a second spring member engaged with the lower guide rail and the bottom face portion for energizing the lower guide rail toward the upper guide rail side.

In the substrate mounting apparatus according to the present invention, the lower guide rail has one of front and rear ends supported rotatably on the bottom face portion of the electronic circuit unit frame and the other formed arcuately movably toward the upper guide rail side.

In the substrate mounting apparatus according to the present invention, the upper guide groove of the upper guide rail is opened on a substrate insertion port side of the electronic circuit unit frame and a lower side, the lower guide groove of the lower guide rail is opened on the substrate insertion port side and an upper side and the upper and lower guide grooves are provided with a slant portion such that the substrate insertion port side is widened.

DETAILED DESCRIPTION OF THE PREFERRED EMBODIMENTS (First embodiment)

Figure 1:
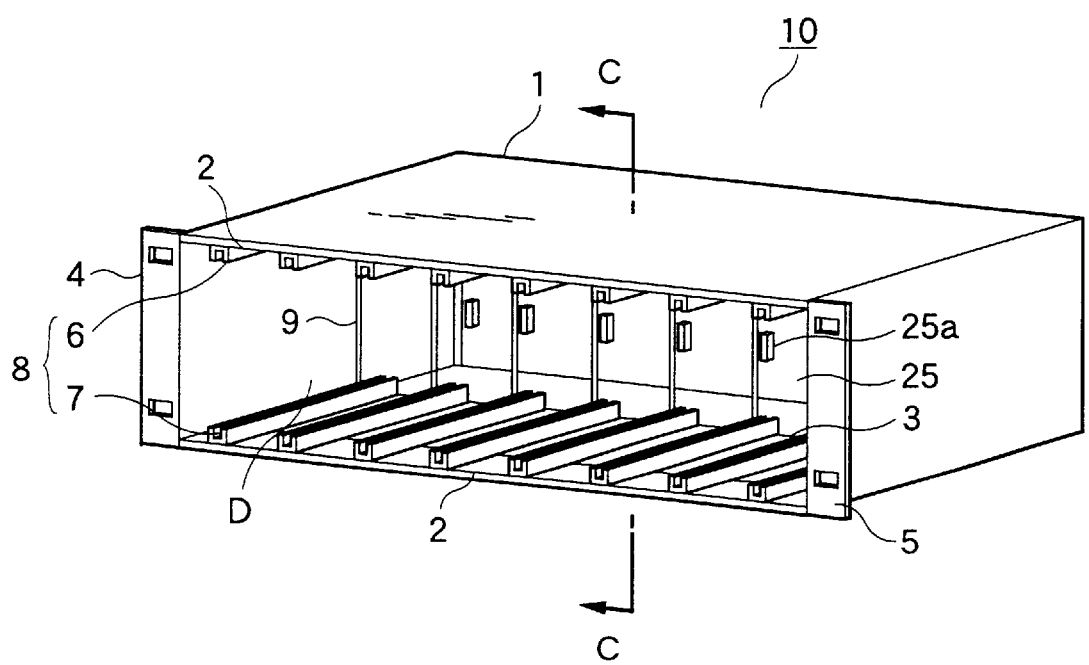
FIG. 1 is a view illustrating a substrate mounting apparatus according to a first embodiment of the present invention.
Figure 2:
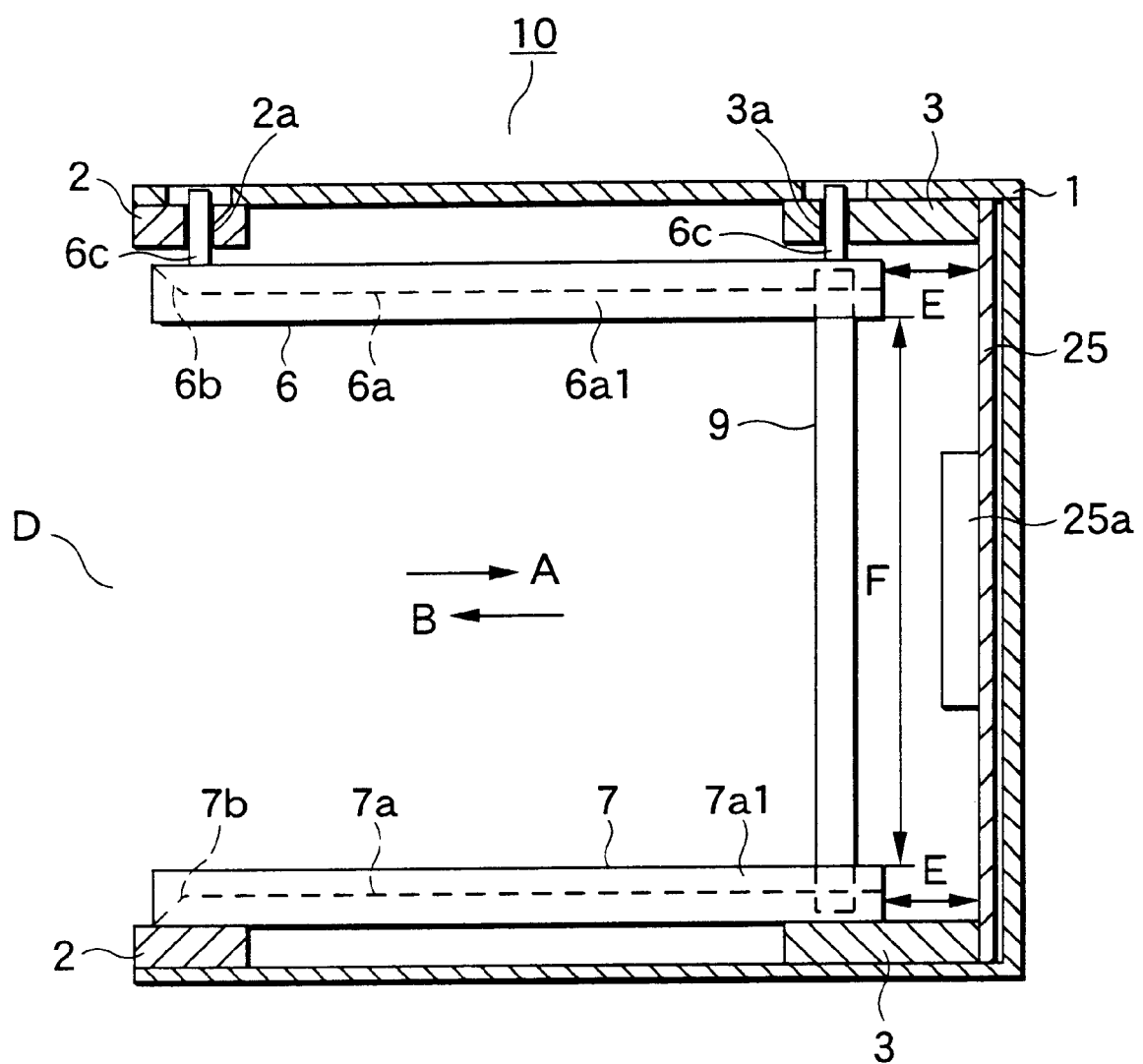
FIG. 2 is a sectional view taken along the line C—C shown in FIG. 1.
Figure 14:
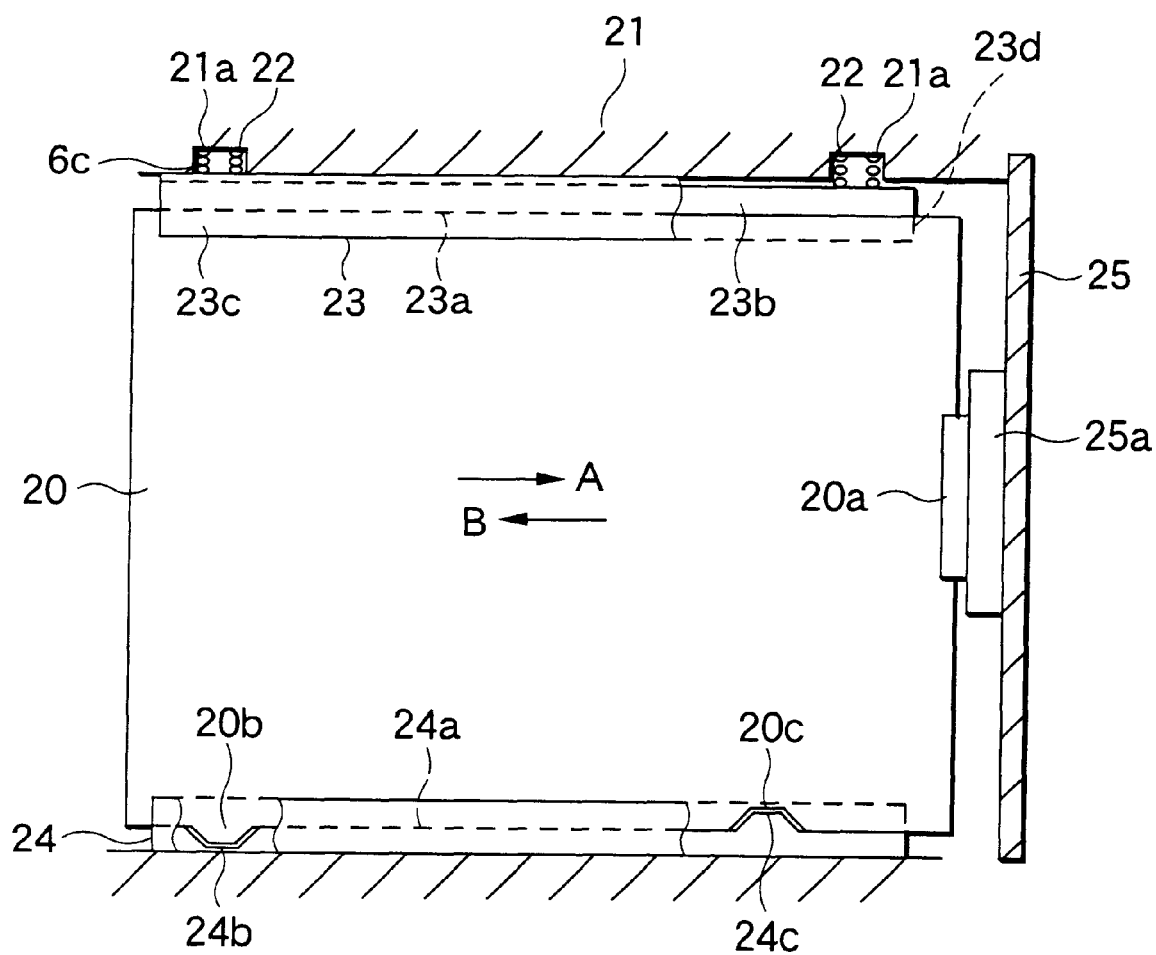
FIG. 14 is a view illustrating a conventional substrate mounting apparatus.
Figure 15:
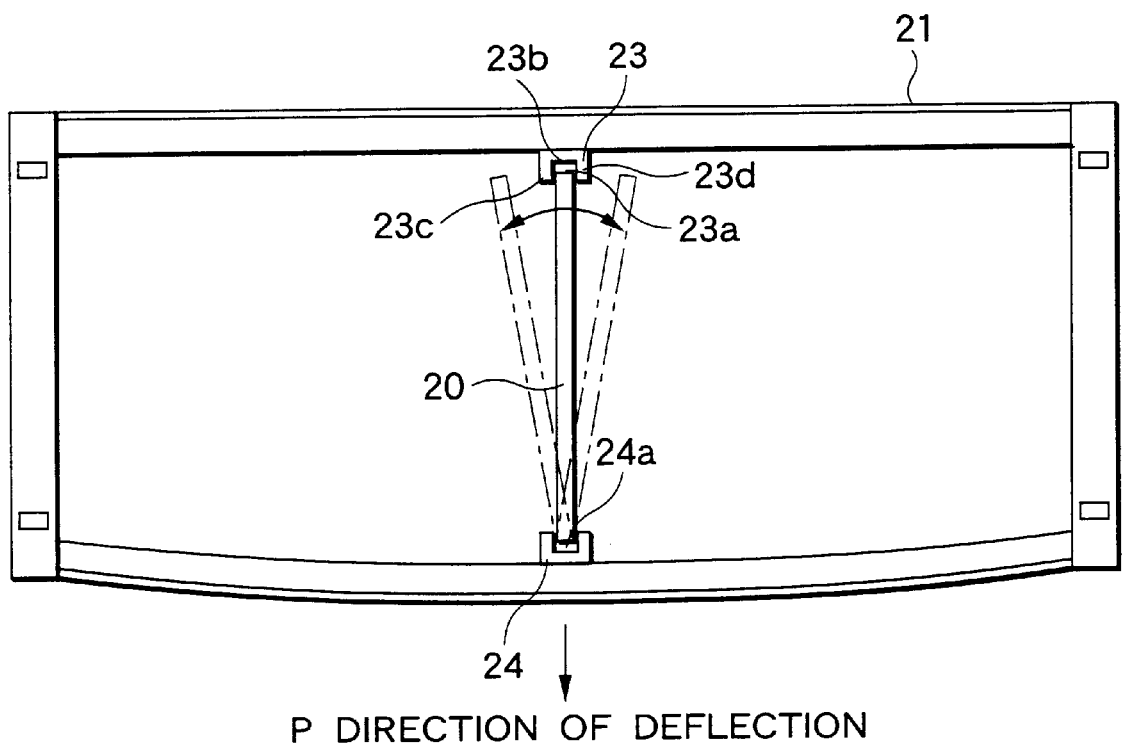
FIG. 15 is a view illustrating the deflection state of a conventional shelf.

A substrate mounting apparatus according to an embodiment of the present invention will be described below. FIG. 1 is a perspective view showing a substrate mounting apparatus according to a first embodiment of the present invention, and FIG. 2 is a sectional view taken along the line C—C in FIG. 1. In the drawings, the same reference numerals as those in FIG. 14 or FIG. 15 denote the same or corresponding portions and description thereof will be omitted. In FIG. 1, the reference numeral 1 denotes an electronic circuit unit frame (which will be hereinafter referred to as a shelf) for removably accommodating a substrate 20 (shown in FIG. 14) in a predetermined mounting position.

The reference numeral 2 denotes a front rail provided in upper and bottom face portions of the shelf 1, which is elongated in a transverse direction on an edge portion of a substrate insertion port D of the shelf 1. The reference numeral 3 denotes a rear rail provided in the upper and bottom face portions of the shelf 1, which is elongated in the transverse direction in an insertion terminating portion on the tip side of the substrate 20.

As shown in FIGS. 1 and 2, a predetermined distance E is provided between a backboard substrate 25 positioned in the vicinity of the internal wall surface of the shelf 1 facing in an insertion direction A of the substrate 20 and fixed to the rear rail 3 and a rear end of a guide rail portion 8. The reference numerals 4 and 5 denote attachment portions which are provided to attach the shelf 1 to a higher device (not shown).

The mounting position of the substrate 20 according to the first embodiment implies a position where a connector 20a (shown in FIG. 14) of the substrate 20 and a connector 25a of the backboard substrate 25 are connected to each other.

In FIGS. 1 and 2, the reference numeral 6 denotes an upper guide rail which is elongated in a longitudinal direction, that is, insertion/discharge directions A and B of the substrate 20 and can be moved vertically with respect to the shelf 1. In the upper guide rail 6, the predetermined distance E is provided between a rear end face thereof and the backboard substrate 25. Therefore, the upper guide rail 6 does not come in contact with the backboard substrate 25 and electronic parts (not shown) provided on the backboard substrate 25 even if it is moved vertically. The reference numeral 6a denotes an upper guide groove of the upper guide rail 6 which is provided from the substrate insertion port D of the shelf 1 to the vicinity of the mounting position. The upper guide groove 6a is opened on the substrate insertion port D side and the lower side. The reference numeral 6b denotes a slant portion provided on the substrate insertion port D side of the upper guide groove 6a, thereby increasing a space with the lower guide groove 7a.

The reference numeral 6c denotes a support piece which is erected upward from front and rear ends of the upper guide rail 6 and penetrates through hole portions 2a and 3a of front and rear rails 2 and 3 on the upper face side so that the upper guide rail 6 can be moved only vertically.

The reference numeral 7 denotes a lower guide rail which is elongated in the insertion/discharge directions A and B and has a front end fixed to the front rail 2 in the bottom face portion and a rear end fixed to the rear rail 3 in the bottom face portion. The lower guide rail 7 has a predetermined distance E provided between a rear end face thereof and the backboard substrate 25, and does not come in contact with the backboard substrate 25 and electronic parts (not shown) provided on the backboard substrate 25. The reference numeral 7a denotes a lower guide groove of the lower guide rail 7 which is provided from the substrate insertion port D to the vicinity of the mounting position. The lower guide groove 7a is opened upward on the substrate insertion port D side. The reference numeral 7b denotes a slant portion provided on the substrate insertion port D side of the lower guide groove 7a such that a space formed together with the upper guide groove 6a is increased.

The reference numeral 8 denotes a guide rail portion for guiding and supporting the substrate 20 from the substrate insertion port D to the mounting position, and includes structures indicated as 6 and 7. The guide rail portion 8 guides and supports the substrate 20 (shown in FIG. 14) in the mounting position through the upper guide rail 6 and the lower guide rail 7 which are positioned in the upper and bottom face portions of the shelf 1 and are opposed to each other. A plurality of guide rail portions 8 are provided in the shelf 1 with a predetermined pitch in the transverse direction of the shelf 1.

The reference numeral 9 denotes space holding means which is bar-shaped and has an upper end fixed to the side surface of the rear end of the upper guide rail 6 and a lower end fixed to the side surface of the rear end of the lower guide rail 7, thereby holding the upper and lower guide rails 6 and 7 with a predetermined space F. As described in the first embodiment, the space holding means 9 is desirably provided on each guide rail portion 8, which is not restricted. The space holding means 9 may be provided on every other guide rail portion 8 or may be provided on only the guide rail portion 8 in a central part. The reference numeral 10 denotes a substrate mounting apparatus including structures indicated as 1 to 9 and a structure indicated as 25.

Figure 3:
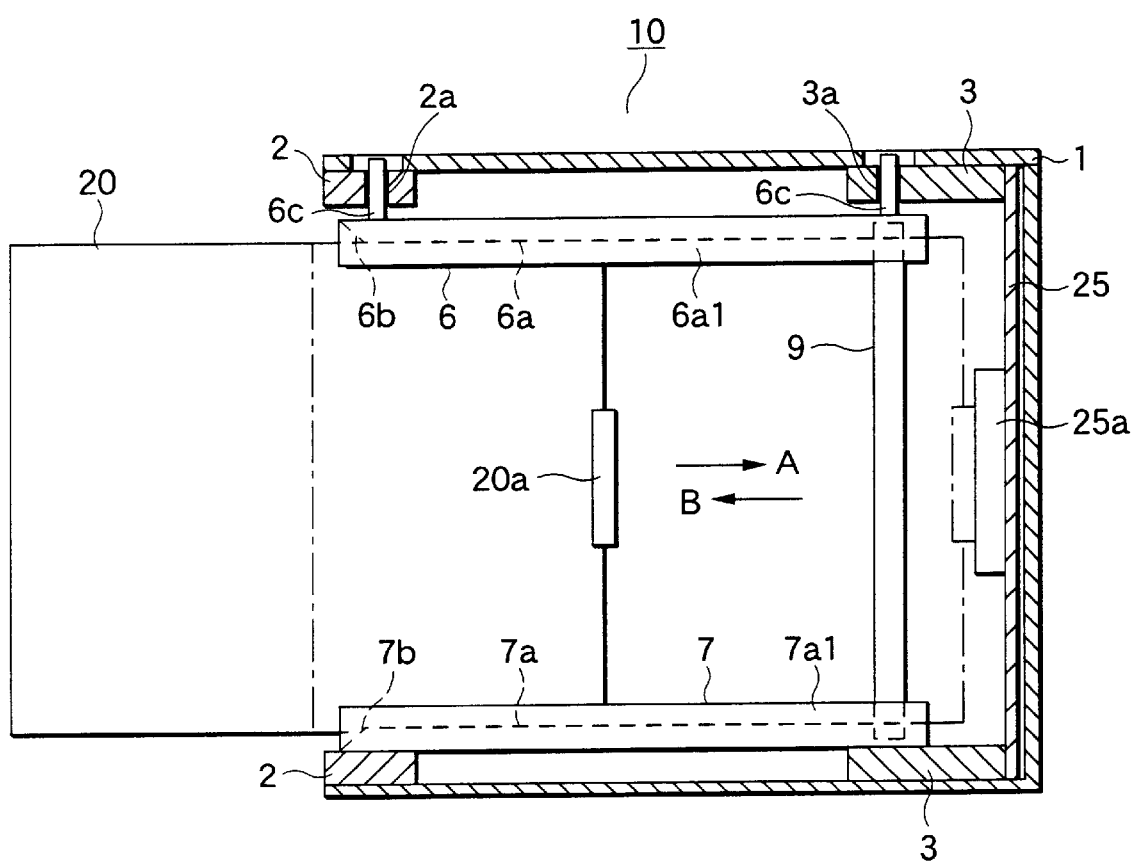
FIG. 3 is a view illustrating an operation for attaching a substrate according to the first embodiment of the present invention.

Next, an operation will be described with reference to the drawings. FIG. 3 is a view illustrating an operation for attaching the substrate. First of all, the upper and lower side edge portions of the substrate 20 are inserted into the upper and lower guide grooves 6a and 7a and are moved in the insertion direction A, respectively. In this case, the slant portions 6b and 7b are provided on the upper and lower guide grooves 6a and 7a. Therefore, the upper and lower side edge portions of the substrate 20 can easily be inserted into the upper and lower guide grooves 6a and 7a. Thus, the substrate 20 can easily be attached.

Next, the side surfaces of the upper and lower side edge portions of the substrate 20 are engaged with groove side walls 6a1 and 7a1 of the upper and lower guide grooves 6a and 7a respectively so that movement in the transverse direction is controlled. In the mounting position, the connector 20a is connected to the connector 25a of the backboard 25. Thus, the substrate 20 is completely mounted.

Figure 4:
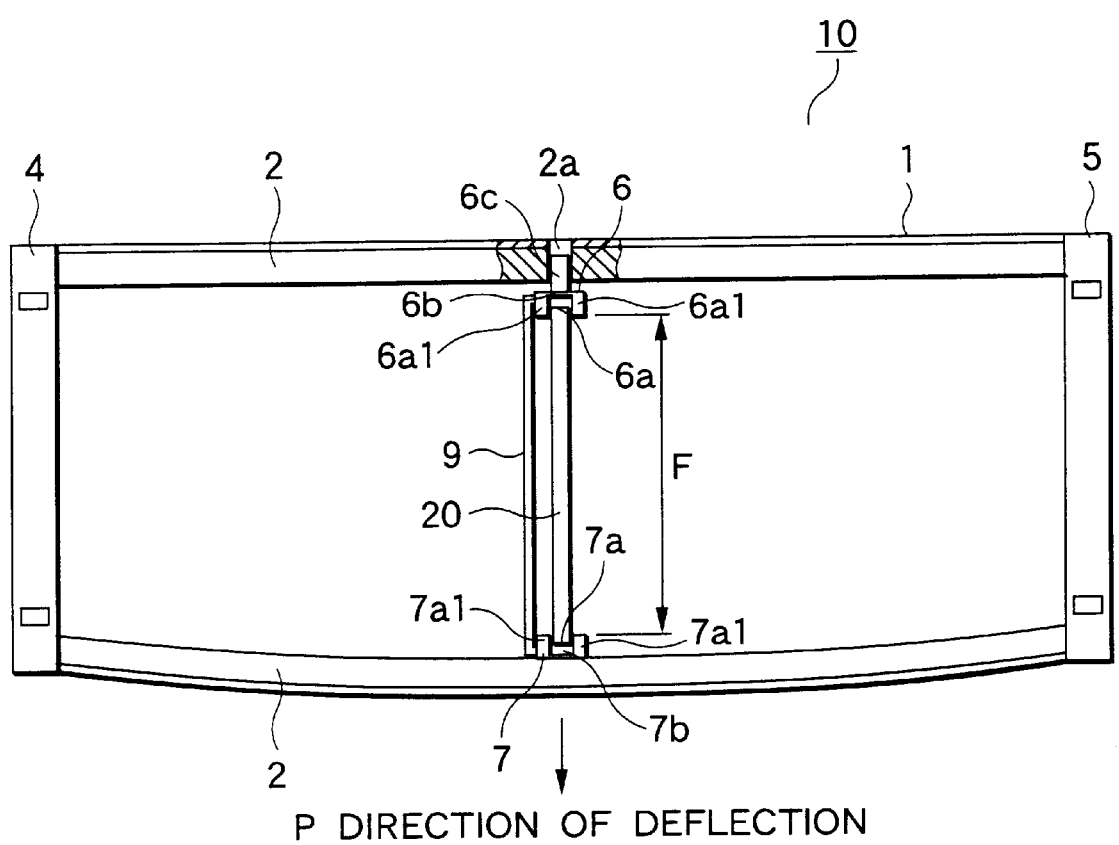
FIG. 4 is a view illustrating the deflection state of a shelf according to the first embodiment of the present invention.

Then, in the case in which some substrates 20 are supported on the guide rail portion 8 and the connector 20a is not connected to the connector 25a during the installment of the substrate mounting apparatus 10 and the adjusting work, the bottom face portion of the shelf 1 is also deflected downward so that a space between the upper and bottom face portions of the shelf 1 is increased as shown in FIG. 4. According to the substrate mounting apparatus 10, however, even if the shelf 1 is brought into such a state, the upper guide rail 6 can be moved vertically with respect to the shelf 1 and a space between the upper guide rail 6 and the lower guide rail 7 is held to be the predetermined space F by the space holding means 9. Therefore, the upper and lower edge portions of the substrate 20 are engaged with the groove side walls 6a1 and 7a1 of the upper and lower guide grooves 6a and 7a. Consequently, the substrate 20 does not fall down.

The substrate mounting apparatus 10 according to the first embodiment comprises the shelf 1 for accommodating the substrate 20 in a predetermined mounting position, the guide rail portion 8 having the upper and lower guide rails 6 and 7 positioned in the upper and bottom face portions of the shelf 1 and opposed to each other and serving to guide and support the substrate 20 in the mounting position, and the space holding means 9 for holding the upper and lower guide rails 6 and 7 with the predetermined space F therebetween when the substrate 20 is to be guided and supported. The upper guide rail 6 can be moved vertically with respect to the shelf 1. Therefore, even if the shelf 1 is deflected downward, the space between the upper and lower guide rails 6 and 7 is rarely changed and the substrate 20 is surely supported on the guide rail portion 8. Consequently, it is possible to prevent the substrate 20 from falling down.

Moreover, the space holding means 9 is a bar-shaped member which is formed integrally with the side surfaces of the upper and lower guide rails 6 and 7 in the rear end portions of the upper and lower guide rails 6 and 7 on the insertion terminating side of the substrate 20. Therefore, the mounting area of the electronic parts provided on the substrate 20 is rarely damaged and the space between the upper and lower guide rails 6 and 7 can be held to be the predetermined space F.

Furthermore, the slant portions 6b and 7b are formed in the upper and lower guide grooves 6a and 7a such that the substrate insertion port D side is widened. Consequently, the upper and lower side edge portions of the substrate 20 can easily be inserted into the upper and lower guide grooves 6a and 7a.

Moreover, the guide rail portion 8 has the predetermined distance E with the backboard substrate 25. Therefore, the upper and lower guide rails 6 and 7 do not come in contact with the backboard substrate 25 and the electronic parts (not shown) provided on the backboard substrate 25. Accordingly, it is possible to increase the degree of freedom of design such as the number of the electronic parts provided on the backboard substrate 25 or arrangement thereof.

(Second Embodiment)

Figure 5A:
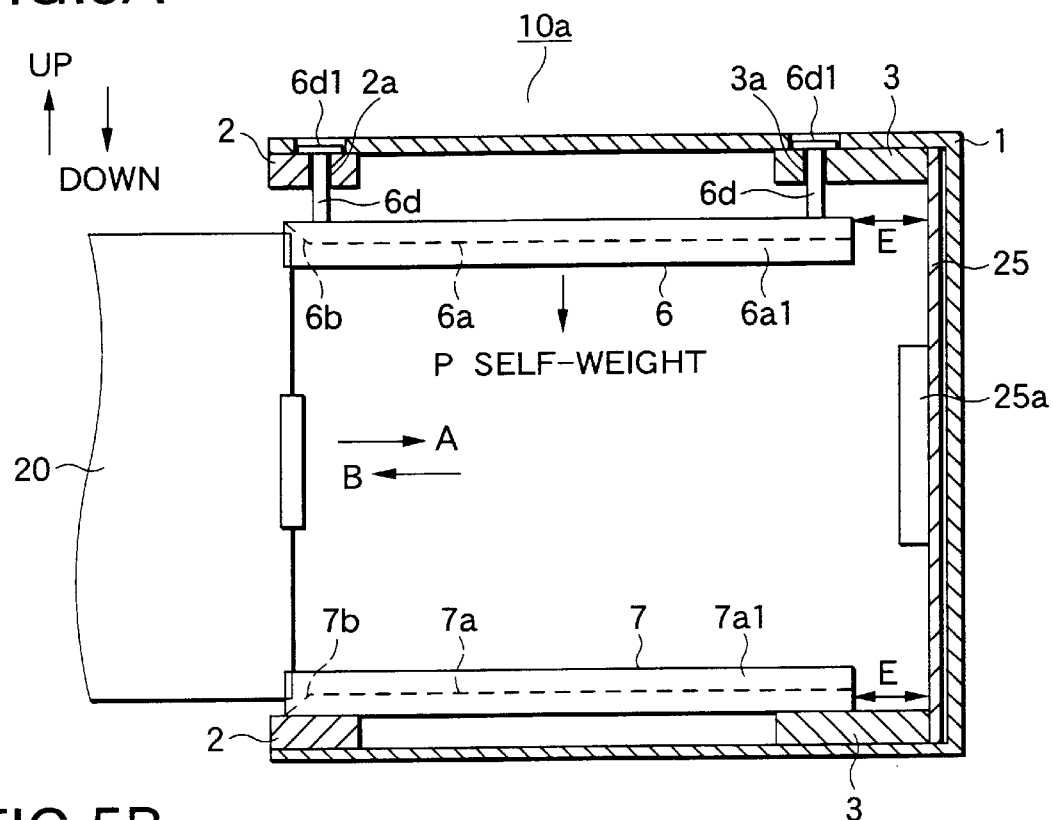
FIGS. 5A and 5B are views illustrating a substrate mounting apparatus according to a second embodiment of the present invention.
Figure 5B:
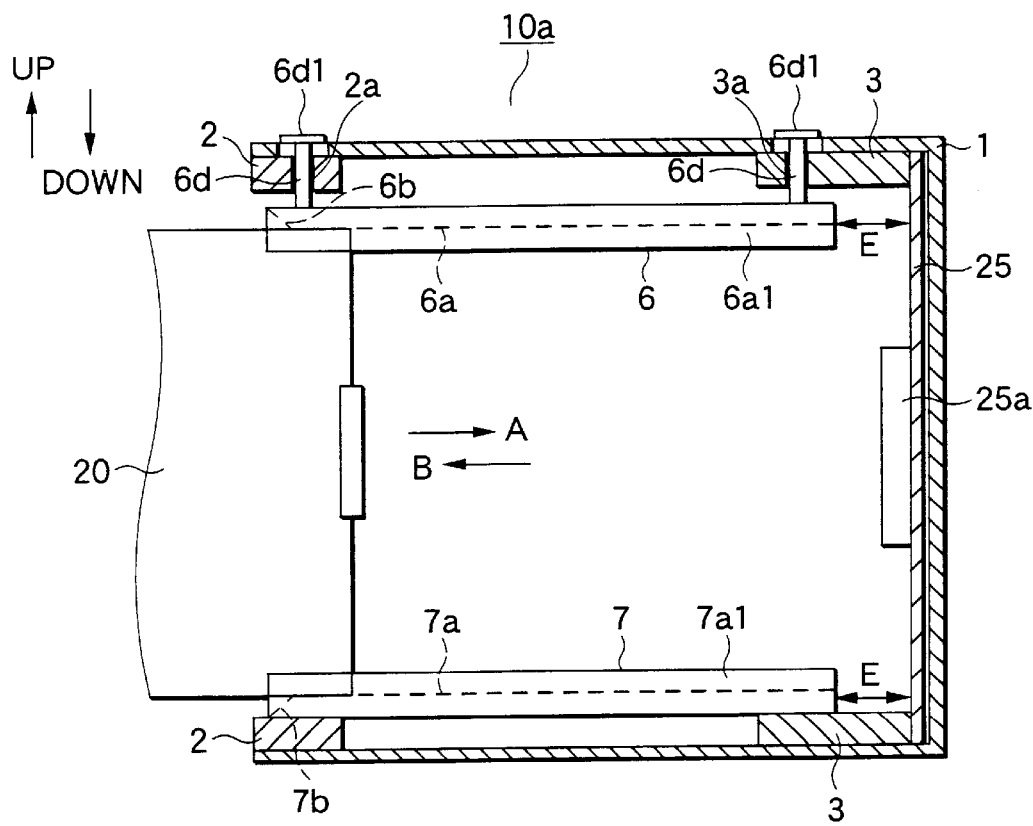

A substrate mounting apparatus according to another embodiment of the present invention will be described below. FIG. 5 is a view illustrating a substrate mounting apparatus according to a second embodiment, FIG. 5A showing a state obtained before the insertion of a substrate and FIG. 5B showing a state obtained after the insertion of the substrate. In the drawings, the same reference numerals as those in FIGS. 1 to 4 denote the same or corresponding portions and their description will be omitted. The reference numeral 6d denotes a support piece which is erected upward from front and rear ends of an upper guide rail 6 respectively and penetrates through hole portions 2a and 3a of front and rear rails 2 and 3 on the upper face portion side such that the upper guide rail 6 can be moved only in a vertical direction and the maximum amount of downward movement is set through a snap ring 6d1 in an upper part. The maximum amount of downward movement of the upper guide rail 6 is set larger than the maximum value of the deflection amount of a bottom face portion of a shelf 1. The reference numeral 10a denotes a substrate mounting apparatus in which space holding means 9 is omitted and the upper guide rail 6 is energized by a self-weight toward a lower guide rail 7 side in a lower part differently from the substrate mounting apparatus 10 shown in FIG. 1.

Accordingly, when the bottom face portion of the shelf 1 is deflected downward and a substrate 20 is moved downward, the whole upper guide rail 6 is correspondingly moved downward. Therefore, a groove side wall 6a1 of an upper guide groove 6a can laterally support the upper side edge portion of the substrate 20, thereby preventing the substrate 20 from falling down laterally.

When the substrate 20 is to be attached, upper and lower corner portions of the substrate 20 are caused to abut on upper and lower slant portions 6b and 7b to move the substrate 20 in an insertion direction A as shown in FIG. 5A. Consequently, the substrate 20 slightly pushes the upper guide rail 6 according to an inclination of the slant portion 6b against the self-weight of the upper guide rail 6, and is moved in a state in which it is guided and supported by the upper and lower guide rails 6 and 7 as shown in FIG. 5B. Thus, the slant portions 6b and 7b are provided on the upper and lower guide grooves 6a and 7a. Therefore, the upper and lower side edge portions of the substrate 20 can easily be inserted into the upper and lower guide grooves 6a and 7a. Thus, the substrate 20 can easily be attached.

(Third Embodiment)

Figure 6A:
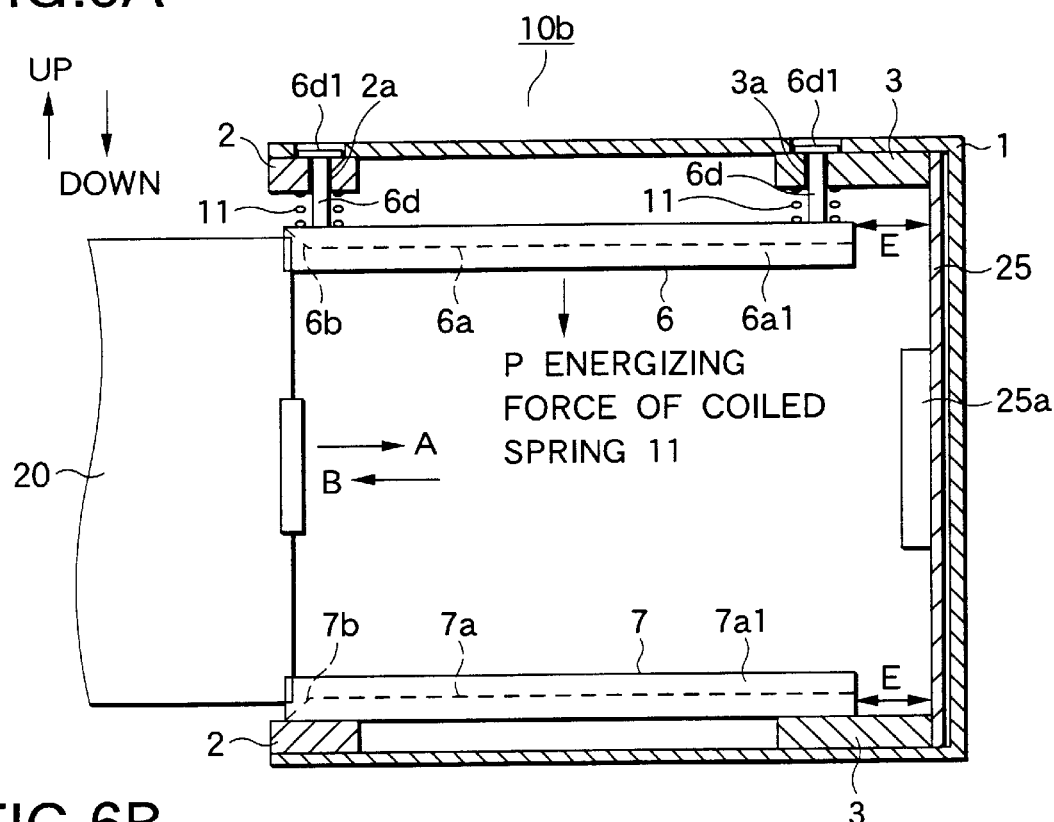
FIGS. 6A and 6B are views illustrating a substrate mounting apparatus according to a third embodiment of the present invention.
Figure 6B:
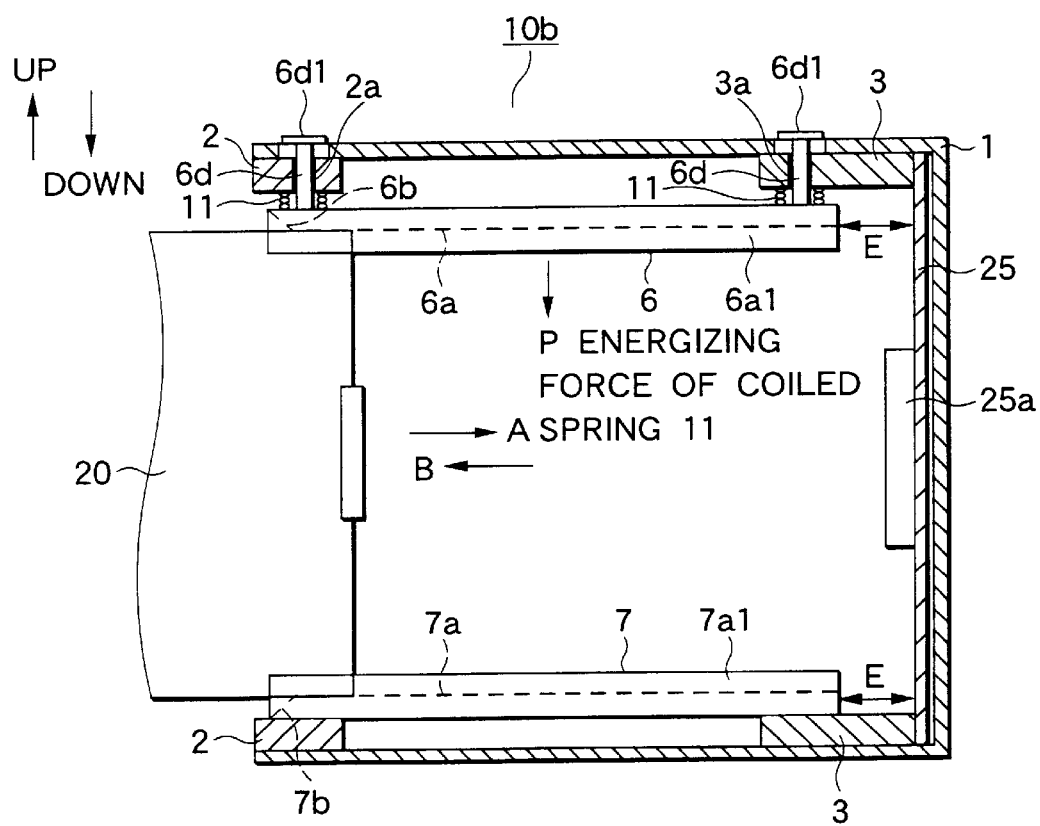

A substrate mounting apparatus according to yet another embodiment of the present invention will be described below. FIG. 6 is a view illustrating a substrate mounting apparatus according to a third embodiment, FIG. 6A showing a state obtained before the insertion of a substrate and FIG. 6B showing a state obtained after the insertion of the substrate. In the drawings, the same reference numerals as those in FIGS. 1 to 5 denote the same or corresponding portions and their description will be omitted. The reference numeral 11 denotes a coiled spring to be a first spring member which penetrates through a support piece 6d and has an upper end abutting on front and rear rails 2 and 3 on the upper face portion side and a lower end abutting on an upper guide rail 6, thereby energizing the upper guide rail 6 downward. The reference numeral 10b denotes a substrate mounting apparatus which includes structures indicated as 1 to 8 and 11 and a structure indicated as 25.

The substrate mounting apparatus 10b is obtained by addition of the coiled spring 11 to the substrate mounting apparatus 10a shown in FIG. 5, and actively energizes the upper guide rail 6 downward by means of the coiled spring 11. Accordingly, when a bottom face portion of a shelf 1 is deflected downward so that the substrate 20 is moved downward, the whole upper guide rail 6 is surely moved downward. Therefore, the substrate 20 can be supported more reliably than that in the substrate mounting apparatus 10a shown in FIG. 5. Thus, the substrate 20 can be more reliably prevented from falling down.

While the coiled spring 11 has been used as the first spring member in the third embodiment, it is not restricted hereto and a leaf spring may be utilized.

(Fourth Embodiment)

Figure 7A:
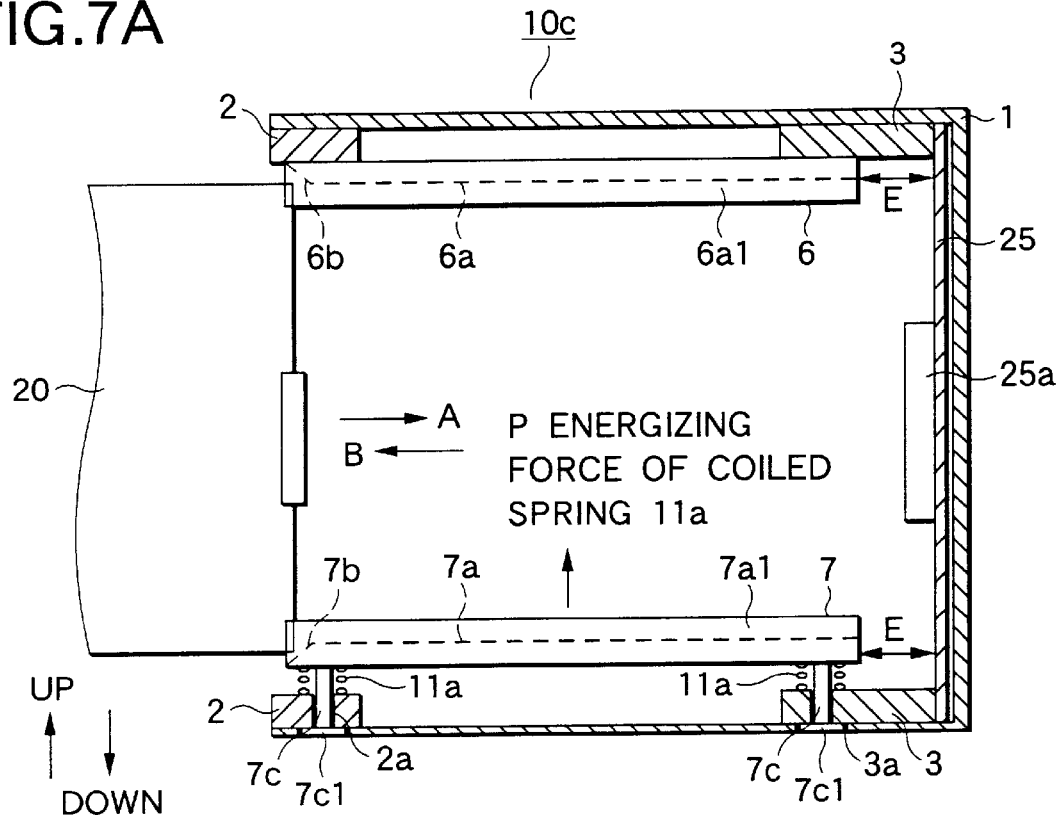
FIGS. 7A and 7B are views illustrating a substrate mounting apparatus according to a fourth embodiment of the present invention.
Figure 7B:
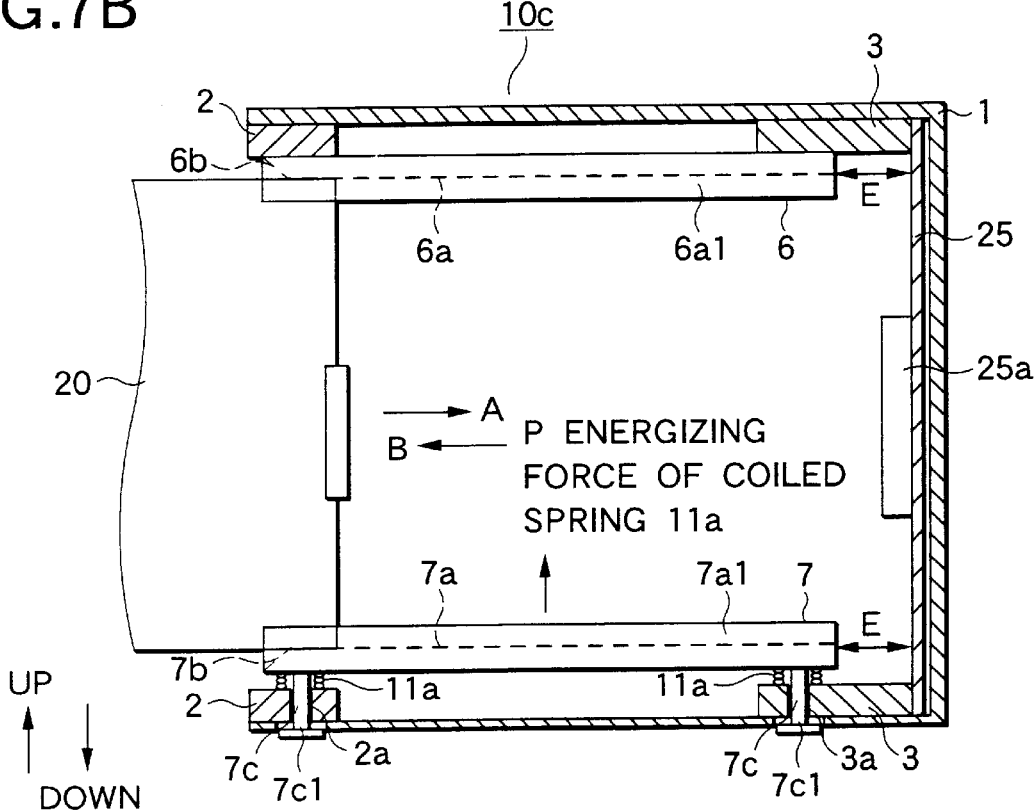

A substrate mounting apparatus according to a further embodiment of the present invention will be described below. FIG. 7 is a view illustrating a substrate mounting apparatus according to a fourth embodiment, FIG. 7A showing a state obtained before the insertion of a substrate and FIG. 7B showing a state obtained after the insertion of the substrate. In the drawings, the same reference numerals as those in FIGS. 1 to 6 denote the same or corresponding portions and their description will be omitted. The reference numeral 7c denotes a support piece which is erected downward from front and rear ends of a lower guide rail 7 respectively and penetrates through hole portions 2a and 3a of front and rear rails 2 and 3 on the bottom face side such that the lower guide rail 7 can be moved only in a vertical direction and the maximum amount of upward movement is set through a snap ring 7c1 in a lower part. The maximum amount of upward movement of the lower guide rail 7 is set larger than the maximum value of the deflection amount of a bottom face portion of a shelf 1. The reference numeral 11a denotes a coiled spring to be a second spring member which penetrates through the support piece 7c, and furthermore, has a lower end abutting on the front and rear rails 2 and 3 on the bottom face portion side and an upper end abutting on the lower guide rail 7, thereby energizing the lower guide rail 7 upward. The reference numeral 10c denotes a substrate mounting apparatus which includes structures indicated as 1 to 8 and 11a and a structure indicated as 25.

As compared with the substrate mounting apparatus 10b shown in FIG. 6, the substrate mounting apparatus 10c has such a structure that an upper guide rail 6 is fixed to the front and rear rails 2 and 3 on the upper face portion side and the lower guide rail 7 is formed vertically movably with respect to the shelf 1, and furthermore, is energized upward by means of the coiled spring 11a. In the substrate mounting apparatus 10c, even if the bottom face portion of the shelf 1 is deflected downward, the coiled spring 11a. energizes the lower guide rail 7 upward by spring force. Therefore, the substrate 20 is rarely moved downward and is maintained to be supported by the upper and lower guide rails 6 and 7. Consequently, it is possible to prevent the substrate 20 from falling down.

(Fifth Embodiment)

Figure 8A:
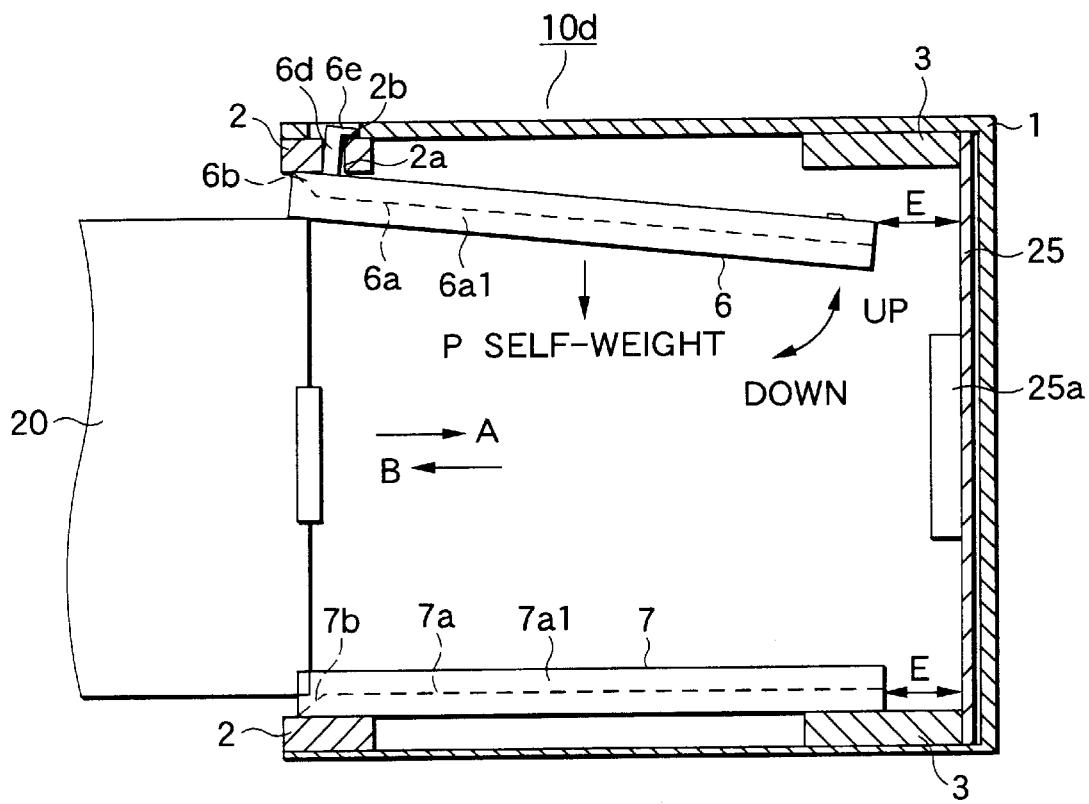
FIGS. 8A and 8B are views illustrating a substrate mounting apparatus according to a fifth embodiment of the present invention.
Figure 8B:
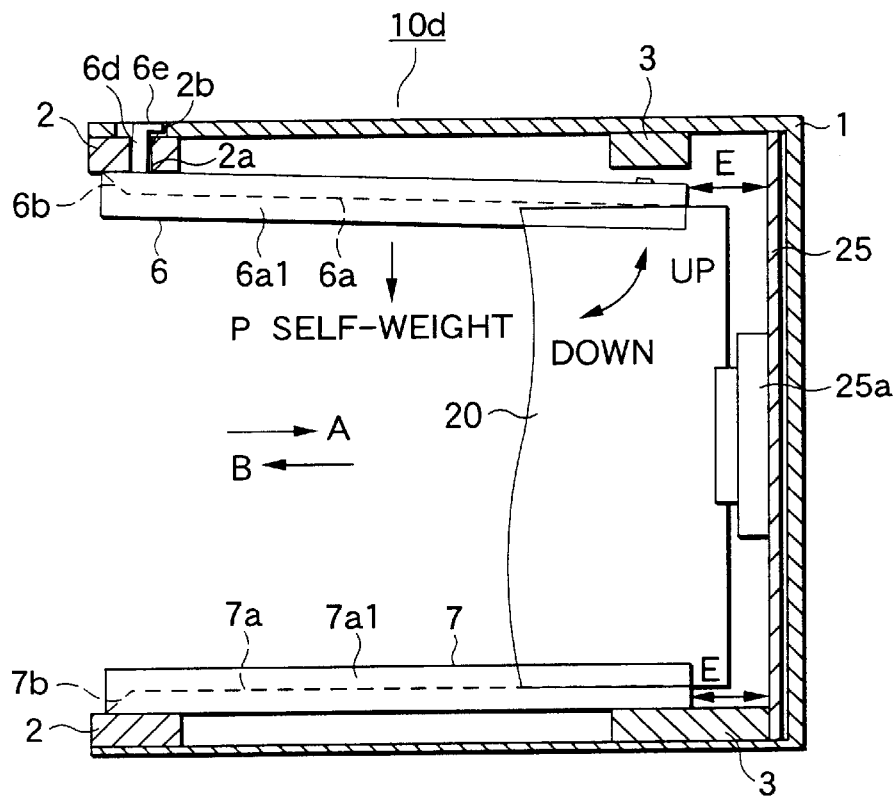

A substrate mounting apparatus according to a further embodiment of the present invention will be described below. FIG. 8 is a view illustrating a substrate mounting apparatus according to a fifth embodiment, FIG. 8A showing a state obtained before the insertion of a substrate and FIG. 8B showing a state obtained after the insertion of the substrate. In the drawings, the same reference numerals as those in FIGS. 1 to 7 denote the same or corresponding portions and their description will be omitted. The reference numeral 6e denotes a hook portion of a support piece 6d which is protruded rearward from an upper end of the support piece 6d. An upper guide rail 6 has the support piece 6d penetrating through a hole portion 2a of a front rail 2 on the upper face portion side and the hook portion 6e of the support piece 6d engaged with an upper edge portion 2b of the hole portion 2a to be the center of rotation. Thus, the upper guide rail 6 is supported rotatably by a looseness of the support piece 6d and the hole portion 2a. Consequently, a rear end can be moved arcuately by a self-weight toward the lower guide rail 7 side. The reference numeral 10d denotes a substrate mounting apparatus which includes structures indicated as 1 to 8 and a structure indicated as 25.

In the substrate mounting apparatus 10d, a rear end of the upper guide rail 6 is rotated by the self-weight toward the lower guide rail 7 side. Therefore, when a bottom face portion of a shelf 1 is deflected downward and the substrate 20 is moved downward, the rear end of the upper guide rail 6 is arcuately moved downward together with a groove side wall 6a1 of an upper guide groove 6a. Consequently, the groove side wall 6a1 laterally supports an upper edge portion of the substrate 20. Consequently, it is possible to prevent the substrate 20 from falling down.

(Sixth Embodiment)

Figure 9A:
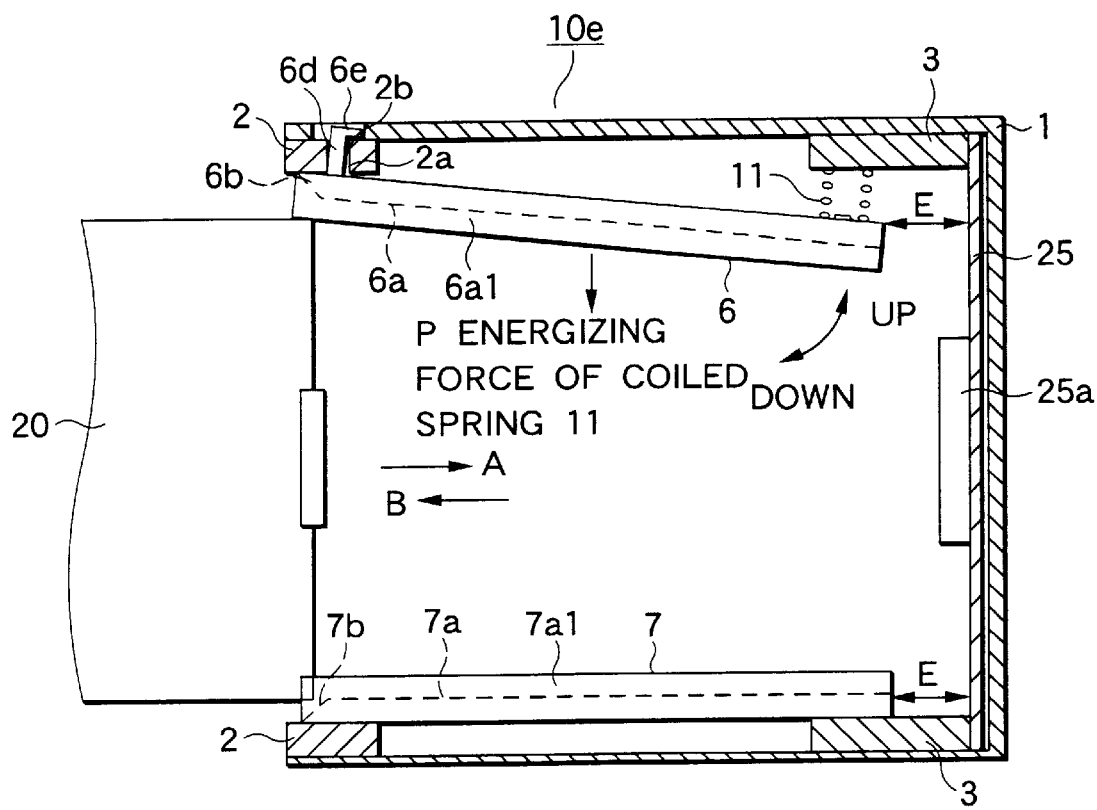
FIGS. 9A and 9B are views illustrating a substrate mounting apparatus according to a sixth embodiment of the present invention.
Figure 9B:
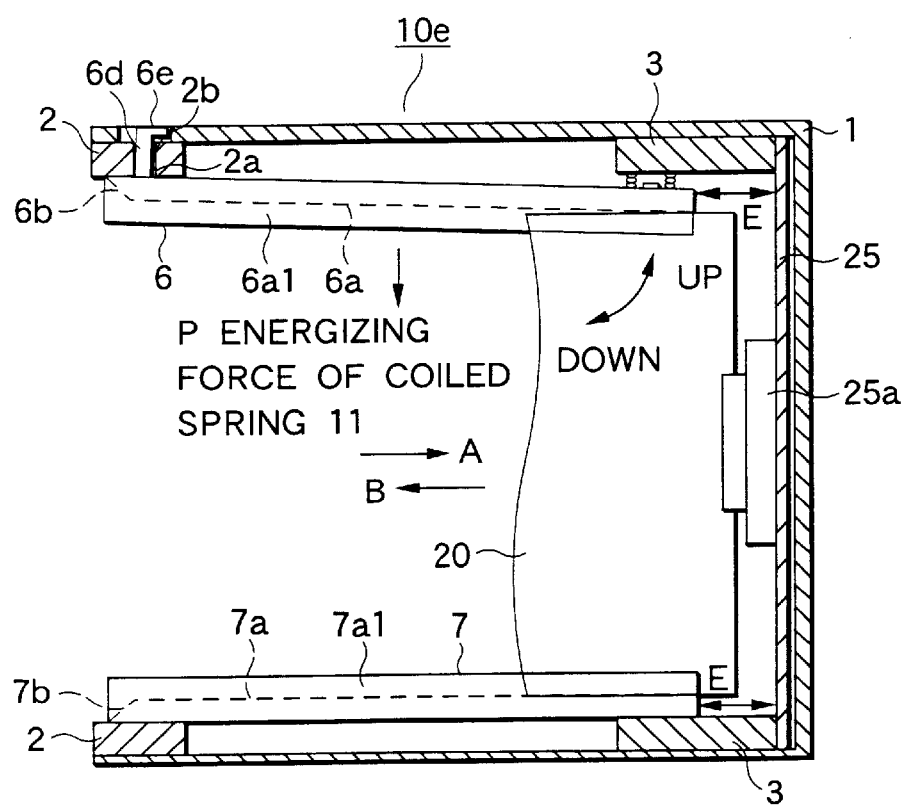

A substrate mounting apparatus according to a further embodiment of the present invention will be described below. FIG. 9 is a view illustrating a substrate mounting apparatus according to a sixth embodiment, FIG. 9A showing a state obtained before the insertion of a substrate and FIG. 9B showing a state obtained after the insertion of the substrate. In the drawings, the same reference numerals as those in FIGS. 1 to 8 denote the same or corresponding portions and their description will be omitted. A coiled spring 11 has an upper end abutting on a rear rail 3 on the upper face side and a lower end abutting on a rear end of an upper guide rail 6, thereby energizing the upper guide rail 6 downward. The reference numeral 10e denotes a substrate mounting apparatus which includes structures indicated as 1 to 8 and 11 and a structure indicated as 25.

The substrate mounting apparatus 10e is obtained by addition of the coiled spring 11 to the substrate mounting apparatus 10d shown in FIG. 8, and actively energizes the upper guide rail 6 downward by means of the coiled spring 11. Accordingly, the rear end of the upper guide rail 6 is surely moved arcuately downward with the downward movement of the substrate 20. Therefore, the substrate 20 can be supported more reliably than that in the substrate mounting apparatus 10d shown in FIG. 8. Thus, it is possible to more surely prevent the substrate 20 from falling down.

(Seventh Embodiment)

Figure 10A:
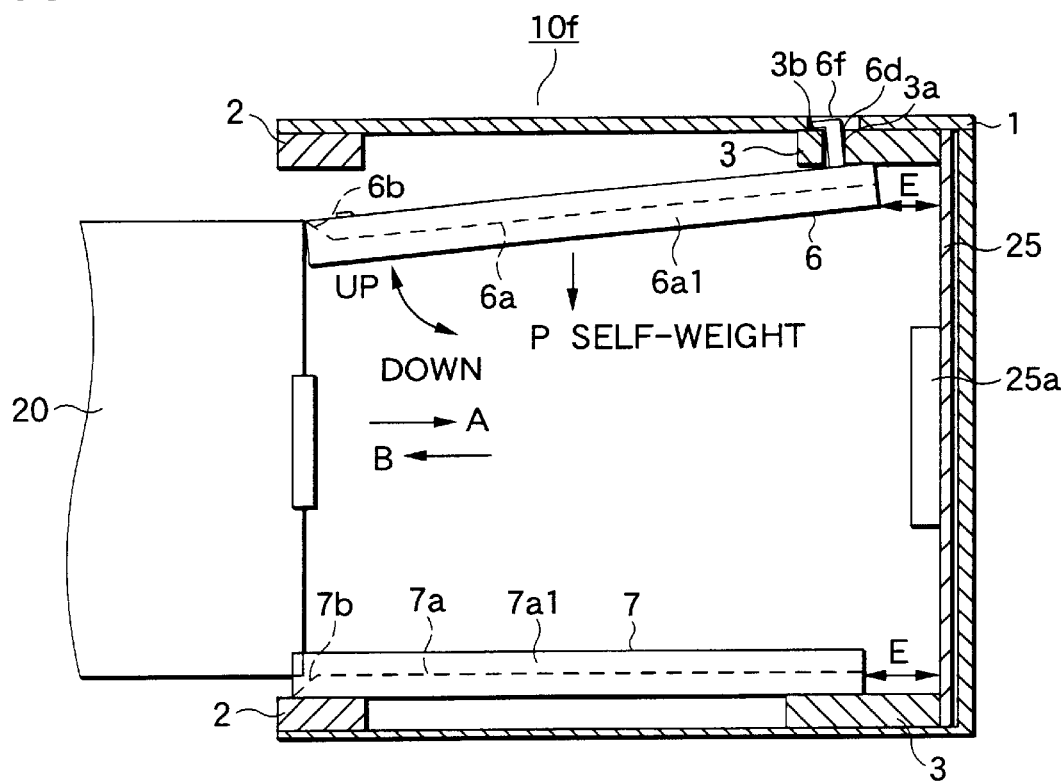
FIGS. 10A and 10B are views illustrating a substrate mounting apparatus according to a seventh embodiment of the present invention.
Figure 10B:
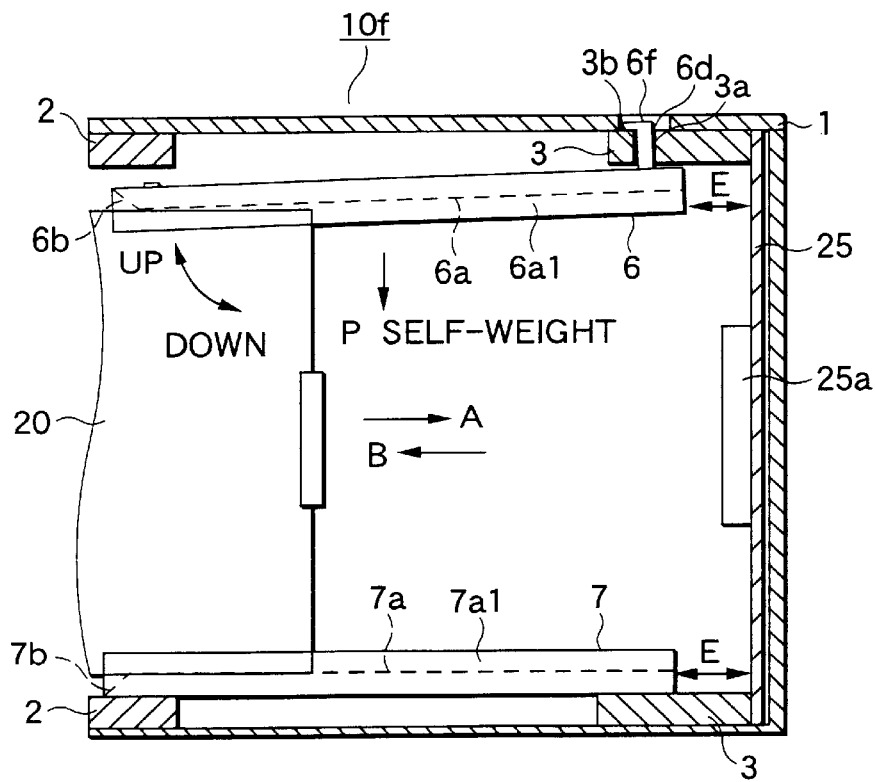

A substrate mounting apparatus according to a further embodiment of the present invention will be described below. FIG. 10 is a view illustrating a substrate mounting apparatus according to a seventh embodiment, FIG. 10A showing a state obtained before the insertion of a substrate and FIG. 10B showing a state obtained after the insertion of the substrate. In the drawings, the same reference numerals as those in FIGS. 1 to 9 denote the same or corresponding portions and their description will be omitted. The reference numeral 6f denotes a hook portion of a support piece 6d which is protruded forward from an upper end of the support piece 6d. An upper guide rail 6 has the support piece 6d penetrating through a hole portion 3a of a rear rail 3 on the upper face side and the hook portion 6f of the support piece 6d engaged with an upper edge portion 3b of the hole portion 3a to be the center of rotation. Thus, the upper guide rail 6 is supported rotatably by a looseness of the support piece 6d and the hole portion 3a. Consequently, a front end can be moved arcuately by a self-weight toward the lower guide rail 7 side. The reference numeral 10f denotes a substrate mounting apparatus which includes structures indicated as 1 to 8 and a structure indicated as 25.

The substrate mounting apparatus 10f has such a structure that the state of support of the upper guide rail 6 is longitudinally inverted as compared with the substrate mounting apparatus 10d shown in FIG. 8. In the same manner as the substrate mounting apparatus 10d shown in FIG. 8, the substrate mounting apparatus 10f can surely support the substrate 20, thereby preventing the substrate 20 from falling down. Moreover, when the front end of the upper guide rail 6 abuts on the substrate 20, a component of force for energizing the substrate 20 toward the insertion direction A side is generated. Therefore, it is possible to suppress the movement of the substrate 20 toward the discharge direction B side.

A slant portion 6b does not become horizontal also in a state in which the substrate 20 has not been inserted as shown in FIG. 10A and a slant having such an angle as to widen the insertion port D side of the substrate 20 is provided.

(Eighth Embodiment)

Figure 11A:
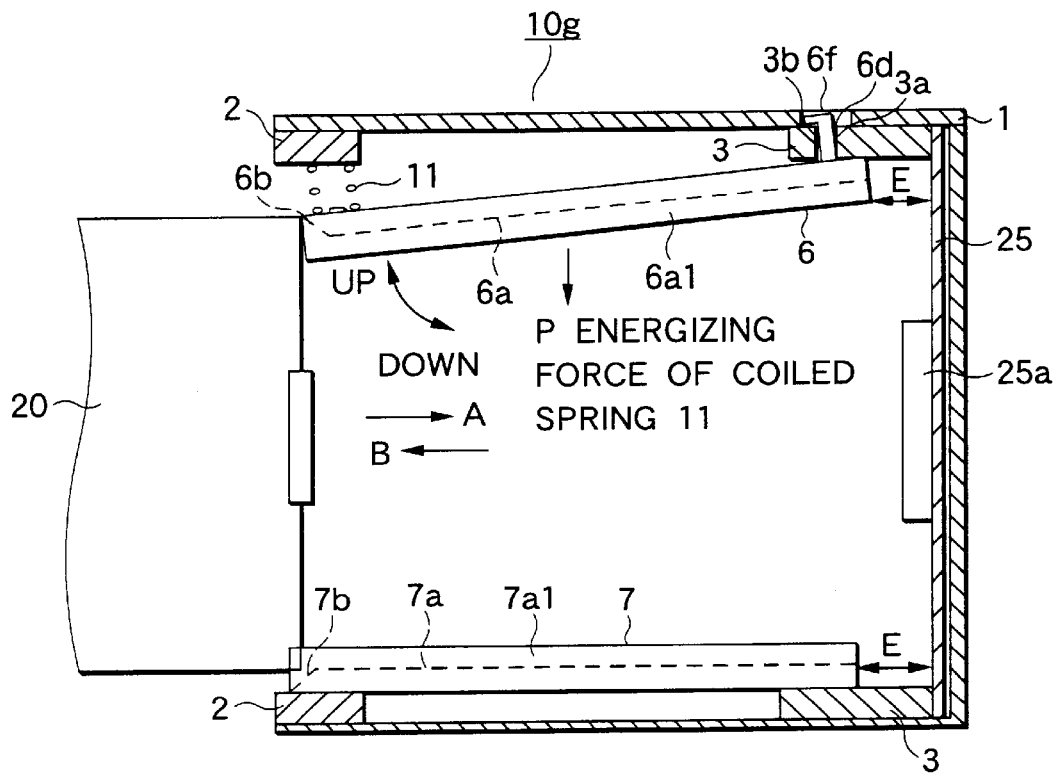
FIGS. 11A and 11B are views illustrating a substrate mounting apparatus according to an eighth embodiment of the present invention.
Figure 11B:
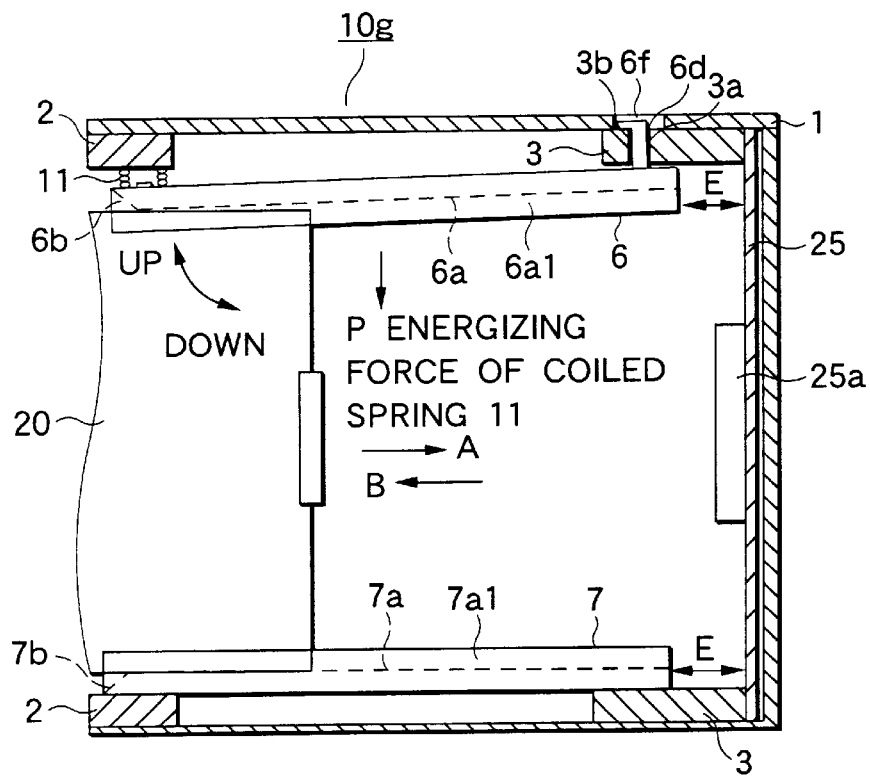

A substrate mounting apparatus according to a further embodiment of the present invention will be described below. FIG. 11 is a view illustrating a substrate mounting apparatus according to an eighth embodiment, FIG. 11A showing a state obtained before the insertion of a substrate and FIG. 11B showing a state obtained after the insertion of the substrate. In the drawings, the same reference numerals as those in FIGS. 1 to 10 denote the same or corresponding portions and their description will be omitted. A coiled spring 11 has an upper end abutting on a front rail 2 in an upper face portion and a lower end abutting on a front end of an upper guide rail 6, thereby energizing the upper guide rail 6 downward. The reference numeral 10g denotes a substrate mounting apparatus which includes structures indicated as 1 to 8 and 11 and a structure indicated as 25.

The substrate mounting apparatus 10g is obtained by addition of the coiled spring 11 to the substrate mounting apparatus 10f shown in FIG. 10, and actively energizes the upper guide rail 6 downward by means of the coiled spring 11. Accordingly, the substrate 20 can be supported more reliably than that in the substrate mounting apparatus 10f shown in FIG. 10. Thus, it is possible to more surely prevent the substrate 20 from falling down. Moreover, when the front end of the upper guide rail 6 abuts on the substrate 20, a component of force for energization toward the insertion direction A side is greater than that shown in FIG. 10. Therefore, the movement of the substrate 20 toward the discharge direction B side can be suppressed still more.

(Ninth Embodiment)

Figure 12A:
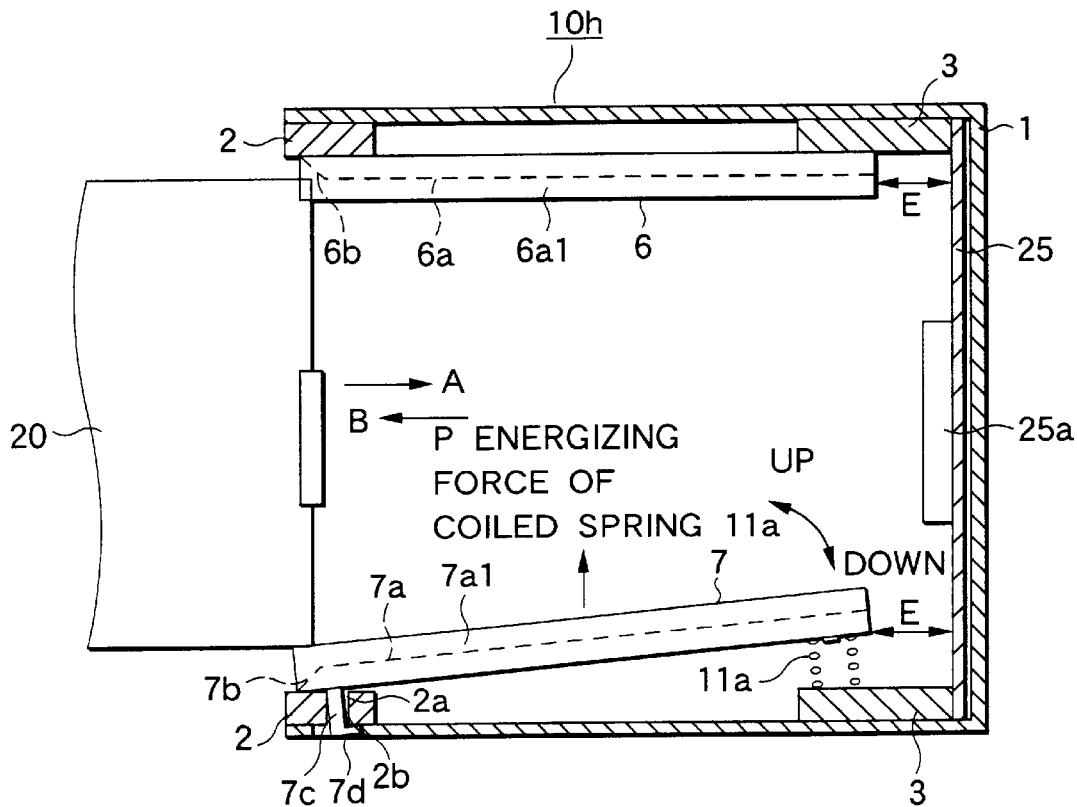
FIGS. 12A and 12B are views illustrating a substrate mounting apparatus according to a ninth embodiment of the present invention.
Figure 12B:
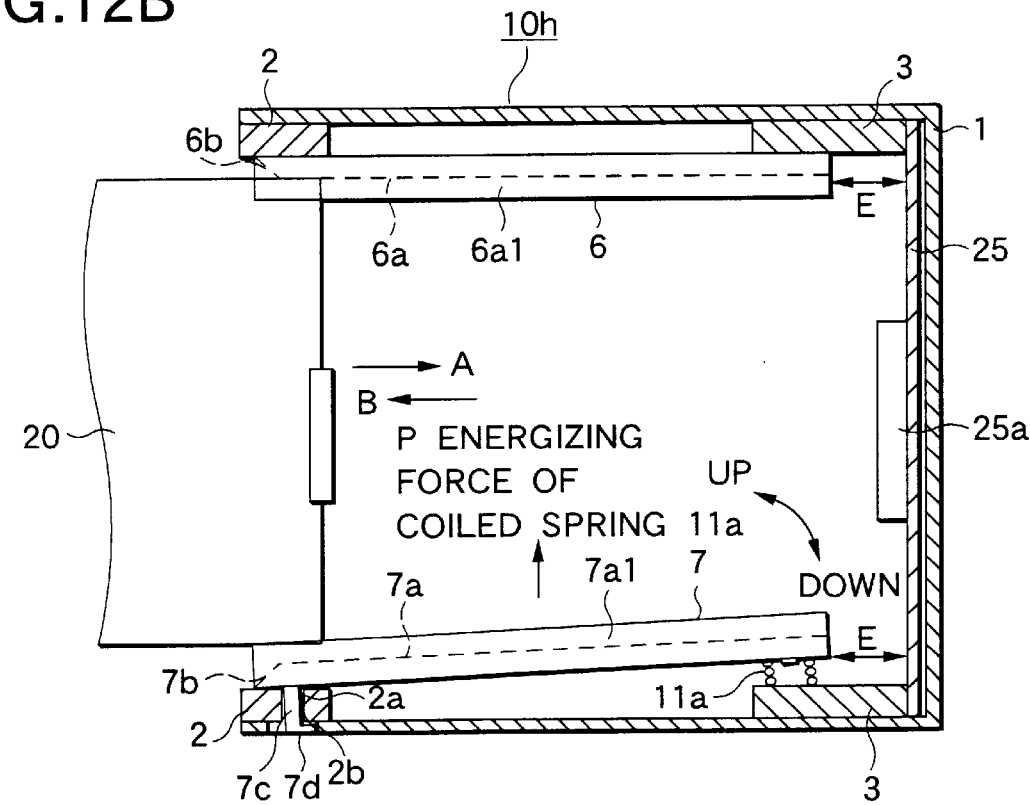

A substrate mounting apparatus according to a further embodiment of the present invention will be described below. FIG. 12 is a view illustrating a substrate mounting apparatus according to a ninth embodiment, FIG. 12A showing a state obtained before the insertion of a substrate and FIG. 12B showing a state obtained after the insertion of the substrate. In the drawings, the same reference numerals as those in FIGS. 1 to 11 denote the same or corresponding portions and their description will be omitted. The reference numeral 7d denotes a hook portion of a support piece 7c which is protruded rearward from a lower end of the support piece 7c. A lower guide rail 7 has the support piece 7c penetrating through a hole portion 2a of a front rail 2 on the bottom face portion side and the hook portion 7d of the support piece 7c engaged with a lower edge portion 2c of the hole portion 2a to be the center of rotation. Thus, the lower guide rail 7 is supported rotatably by a looseness of the support piece 7c and the hole portion 2a. Consequently, a rear end can be moved arcuately by the force of a coiled spring 11a toward the upper guide rail 6 side. The reference numeral 11a denotes a coiled spring to be a second spring member which has an upper end abutting on a rear end of the lower guide rail 7 and a lower end abutting on a rear rail 3 on the bottom face portion side, thereby energizing the lower guide rail 7 upward. The reference numeral 10h denotes a substrate mounting apparatus which includes structures indicated as 1 to 8 and 11a and a structure indicated as 25.

The substrate mounting apparatus 10h has such a structure that the upper and lower guide rails of the substrate mounting apparatus 10e shown in FIG. 9 are fixed reversely, that is, the upper guide rail 6 is fixed and the lower guide rail 7 is rotatably formed, thereby energizing the lower guide rail 7 upward by means of the coiled spring 11a. In the substrate mounting apparatus 10h, even if a bottom face portion of a shelf 1 is deflected downward, the coiled spring 11a. energizes the lower guide rail 7 upward by spring force. Therefore, the substrate 20 is rarely moved downward and is maintained to be supported by the upper and lower guide rails 6 and 7. Consequently, it is possible to prevent the substrate 20 from falling down.

(Tenth Embodiment)

Figure 13A:
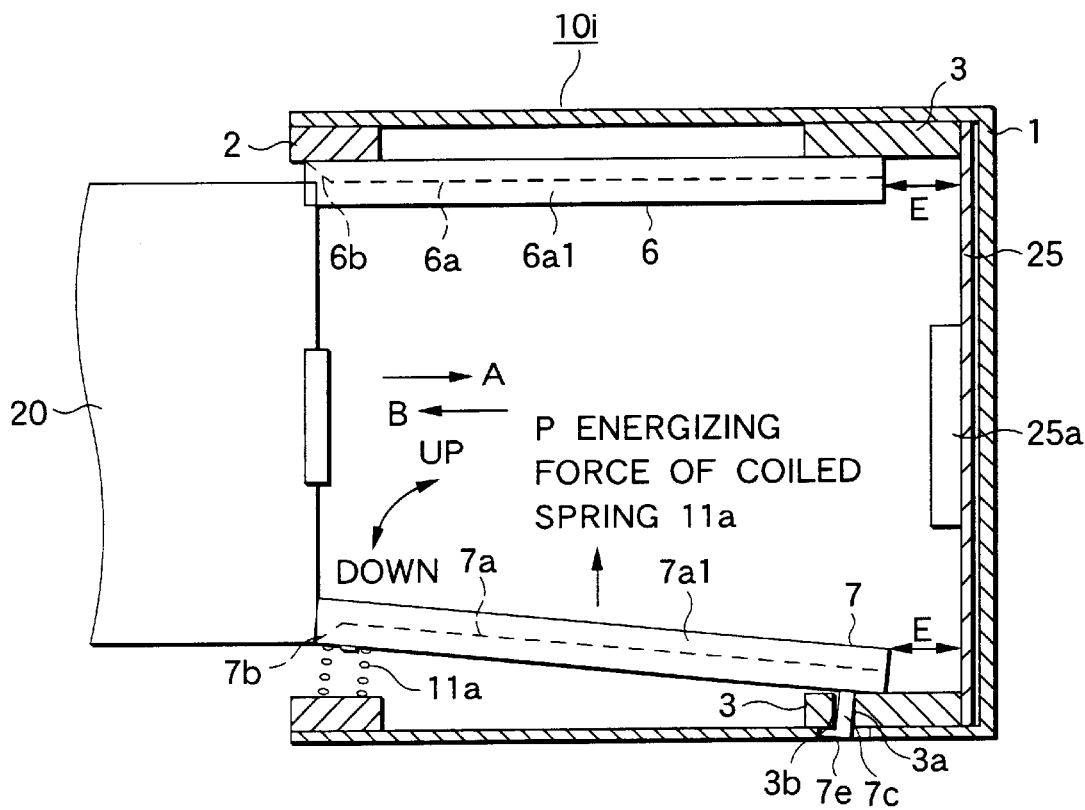
FIGS. 13A and 13B are views illustrating a substrate mounting apparatus according to a tenth embodiment of the present invention.
Figure 13B:
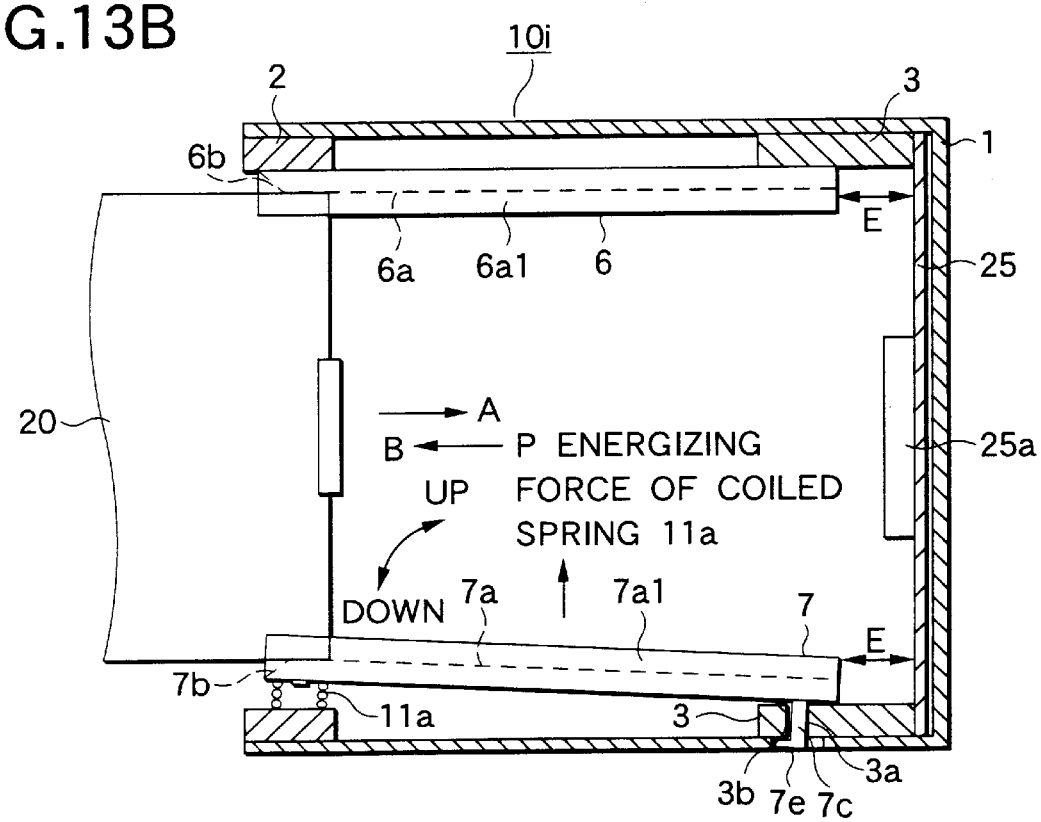

A substrate mounting apparatus according to a further embodiment of the present invention will be described below. FIG. 13 is a view illustrating a substrate mounting apparatus according to a tenth embodiment, FIG. 13A showing a state obtained before the insertion of a substrate and FIG. 13B showing a state obtained after the insertion of the substrate. In the drawings, the same reference numerals as those in FIGS. 1 to 12 denote the same or corresponding portions and their description will be omitted. The reference numeral 7e denotes a hook portion of a support piece 7c which is protruded forward from a lower end of the support piece 7c. A lower guide rail 7 has the support piece 7c penetrating through a hole portion 3a of a rear rail 3 on the bottom face portion side and the hook portion 7e of the support piece 7c engaged with a lower edge portion 3c of the hole portion 3a to be the center of rotation. Thus, the lower guide rail 7 is supported rotatably by a looseness of the support piece 7c and the hole portion 3a. Consequently, a front end can be moved arcuately by the force of a coiled spring 11a toward the upper guide rail 6 side. The reference numeral 11a denotes a coiled spring to be a second spring member which has an upper end abutting on a front end of the lower guide rail 7 and a lower end abutting on a front rail 2 on the bottom face portion side, thereby energizing the lower guide rail 7 upward. The reference numeral 10i denotes a substrate mounting apparatus which includes structures indicated as 1 to 8 and 11a and a structure indicated as 25.

In the substrate mounting apparatus 10i, the coiled spring 11a energizes the lower guide rail 7 upward by spring force in the same manner as in the substrate mounting apparatus 10h shown in FIG. 12. Therefore, the substrate 20 is rarely moved downward and is maintained to be supported by the upper and lower guide rails 6 and 7. Consequently, it is possible to prevent the substrate 20 from falling down. Moreover, when the front end of the upper guide rail 7 abuts on the substrate 20, a component of force for energizing the substrate 20 toward the insertion direction A side is generated. Therefore, it is possible to suppress the movement of the substrate 20 toward the discharge direction B side.

A slant portion 7b does not become horizontal also in a state in which the substrate 20 has not been inserted as shown in FIG. 13A and a slant having such an angle as to widen the insertion port D side of the substrate 20 is provided.

The substrate mounting apparatus according to the present invention comprises an electronic circuit unit frame for accommodating a removable substrate provided with electronic parts in a predetermined mounting position, an upper guide rail having an upper guide groove provided from a substrate insertion port of the electronic circuit unit frame to the vicinity of the mounting position and supported vertically movably on an upper face portion of the electronic circuit unit frame, a lower guide rail having a lower guide groove portion provided from the substrate insertion port to the vicinity of the mounting position and fixed to a bottom face portion of the electronic circuit unit frame with a predetermined space formed together with the upper guide rail, and space holding means formed integrally with the upper and lower guide rails for holding the predetermined space. Therefore, even if the electronic circuit unit frame is deflected downward, the space between the upper and lower guide rails is rarely changed and the substrate is surely supported on the guide rail portion. Consequently, it is possible to prevent the substrate from falling down.

According to the substrate mounting apparatus of the present invention, the space holding means is a bar-shaped member formed integrally with the upper and lower guide rails on respective rear ends of the upper and lower guide rails on an insertion terminating side of the substrate. Consequently, the space between the upper and lower guide rails can be held to be a predetermined space with the mounting area of electronic parts on the substrate damaged rarely.

According to the substrate mounting apparatus of the present invention, the upper guide groove of the upper guide rail is opened on a substrate insertion port side of the electronic circuit unit frame and a lower side, the lower guide groove of the lower guide rail is opened on the substrate insertion port side and an upper side and the upper and lower guide grooves are provided with a slant portion such that the substrate insertion port side is widened. Consequently, the upper and lower side edge portions of the substrate can easily be inserted into the upper and lower guide grooves.

The substrate mounting apparatus according to the present invention comprises an electronic circuit unit frame for accommodating a removable substrate provided with electronic parts in a predetermined mounting position, a lower guide rail having a lower guide groove provided from a substrate insertion port of the electronic circuit unit frame to the vicinity of the mounting position and fixed to a bottom face portion of the electronic circuit unit frame, and an upper guide rail having an upper guide groove provided from the substrate insertion port to the vicinity of the mounting position and supported on an upper face portion of the electronic circuit unit frame movably toward the lower guide rail side in a lower part by a self-weight, wherein a groove side wall of the upper guide groove is formed integrally with the upper guide rail and is moved together with the upper guide rail. Therefore, the space between the upper and lower guide rails can be set to a predetermined space and the substrate can be supported by the upper and lower guide rails. Thus, it is possible to prevent the substrate from falling down.

According to the substrate mounting apparatus of the present invention, the upper guide rail has a substrate insertion port side and a substrate insertion terminating side supported vertically movably on the upper face portion of the electronic circuit unit frame. With the simple structure, consequently, the upper guide rail can be moved to support the substrate corresponding to the movement of the substrate. Thus, it is possible to prevent the substrate from falling down.

According to the substrate mounting apparatus of the present invention, the upper guide rail has one of the substrate insertion port side and the substrate insertion terminating side supported rotatably on the upper face portion of the electronic circuit unit frame and the other formed arcuately movably toward the lower guide rail side. With the simple structure, consequently, the upper guide rail can be moved to support the substrate corresponding to the movement of the substrate. Thus, it is possible to prevent the substrate from falling down.

The present invention provides a substrate mounting apparatus comprising an electronic circuit unit frame for accommodating a removable substrate provided with electronic parts in a predetermined mounting position, a connecting portion positioned in the vicinity of an internal side wall of the electronic circuit unit frame facing in an insertion direction of the substrate to form the mounting position and causing the substrate to be removably mounted thereon, an upper guide rail having an upper guide groove provided from a substrate insertion port of the electronic circuit unit frame to the vicinity of the mounting position and provided in an upper face portion of the electronic circuit unit frame, a lower guide rail having a lower guide groove portion provided from the substrate insertion port to the vicinity of the mounting position and provided in a bottom face portion of the electronic circuit unit frame, and energizing means for energizing one of the upper and lower guide rails toward the other, wherein one of the upper and lower guide rails which is energized by the energizing means is supported vertically movably on the electronic circuit unit frame and formed movably together with a groove side wall of the guide groove laterally supporting an edge portion of the substrate and the upper and lower guide rails are provided to have a predetermined distance with the connecting portion. Consequently, one of the upper and lower guide rails energized by the energizing means can be moved with the movement of the substrate and the substrate can be supported by the upper and lower guide rails. Thus, it is possible to prevent the substrate from falling down.

According to the substrate mounting apparatus of the present invention, the upper guide rail is supported on the upper face portion of the electronic circuit unit frame to be movable toward the lower guide rail side in a lower part, the lower guide rail is fixed to the bottom face portion of the electronic circuit unit frame, and the energizing means is a first spring member engaged with the upper guide rail and the upper face portion for energizing the upper guide rail toward the lower guide rail side. With the simple structure, consequently, one of the upper and lower guide rails which is energized by the energizing means can surely be moved corresponding to the movement of the substrate, thereby supporting the substrate. Thus, it is possible to prevent the substrate from falling down.

According to the substrate mounting apparatus of the present invention, the upper guide rail has one of front and rear ends supported rotatably on the upper face portion of the electronic circuit unit frame and the other formed arcuately movably toward the lower guide rail side. With the simple structure, consequently, one of the upper and lower guide rails which is energized by the energizing means can surely be moved corresponding to the movement of the substrate, thereby supporting the substrate. Thus, it is possible to prevent the substrate from falling down.

According to the substrate mounting apparatus of the present invention, the upper guide rail is fixed to the upper face portion of the electronic circuit unit frame, the lower guide rail is supported on the bottom face portion of the electronic circuit unit frame movably toward the upper guide rail side in an upper part, and the energizing means is a second spring member engaged with the lower guide rail and the bottom face portion for energizing the lower guide rail toward the upper guide rail side. Therefore, the state in which the substrate is rarely moved downward and is supported by the upper and lower guide rails is maintained. Thus, it is possible to prevent the substrate from falling down.

According to the substrate mounting apparatus of the present invention, the lower guide rail has one of front and rear ends supported rotatably on the bottom face portion of the electronic circuit unit frame and the other formed arcuately movably toward the upper guide rail side. With the simple structure, therefore, the state in which the substrate is rarely moved downward and is supported by the upper and lower guide rails is maintained. Thus, it is possible to prevent the substrate from falling down.

According to the substrate mounting apparatus of the present invention, the upper guide groove of the upper guide rail is opened on a substrate insertion port side of the electronic circuit unit frame and a lower side, the lower guide groove of the lower guide rail is opened on the substrate insertion port side and an upper side and the upper and lower guide grooves are provided with a slant portion such that the substrate insertion port side is widened. Therefore, the upper and lower side edge portions of the substrate can easily be inserted into the upper and lower guide grooves.

What is claimed is:

1. A substrate mounting apparatus comprising:

an electronic circuit unit frame for accommodating a removable substrate provided with electronic parts in a predetermined mounting position;

an upper guide rail having an upper guide groove provided from a substrate insertion port of said electronic circuit unit frame to the vicinity of the mounting position and supported vertically movably on an upper face portion of said electronic circuit unit frame;

a lower guide rail having a lower guide groove portion provided from the substrate insertion port to the vicinity of the mounting position and fixed to a bottom face portion of said electronic circuit unit frame with a predetermined space formed together with said upper guide rail; and a space holding means formed integrally with said upper and lower guide rails for holding the predetermined space.

2. The substrate mounting apparatus according to claim 1, wherein said space holding means is a bar-shaped member formed integrally with said upper and lower guide rails on respective rear ends of said upper and lower guide rails on an insertion terminating side of the substrate.

3. The substrate mounting apparatus according to claim 1, wherein an upper guide groove of said upper guide rail is opened on a substrate insertion port side of said electronic circuit unit frame and a lower side, a lower guide groove of said lower guide rail is opened on the substrate insertion port side and an upper side, and the upper and lower guide grooves are provided with a slant portion such that the substrate insertion port side is widened.

4. A substrate mounting apparatus comprising:

an electronic circuit unit frame for accommodating a removable substrate provided with electronic parts in a predetermined mounting position;

a lower guide rail having a lower guide groove provided from a substrate insertion port of said electronic circuit unit frame to the vicinity of the mounting position and fixed to a bottom face portion of said electronic circuit unit frame; and an upper guide rail having an upper guide groove provided from the substrate insertion port to the vicinity of the mounting position and supported on an upper face portion of said electronic circuit unit frame movably toward the lower guide rail side in a lower part by a self-weight, wherein a groove side wall of the upper guide groove is formed integrally with said upper guide rail and is moved together with said upper guide rail.

5. The substrate mounting apparatus according to claim 4, wherein said upper guide rail has a substrate insertion port side and a substrate insertion terminating side supported vertically movably on the upper face portion of said electronic circuit unit frame.

6. The substrate mounting apparatus according to claim 4, wherein said upper guide rail has one of the substrate insertion port side and the substrate insertion terminating side supported rotatably on the upper face portion of said electronic circuit unit frame and the other formed arcuately movably toward the lower guide rail side.

7. A substrate mounting apparatus comprising:

an electronic circuit unit frame for accommodating a removable substrate provided with electronic parts in a predetermined mounting position;

a connecting portion positioned in the vicinity of an internal side wall of said electronic circuit unit frame facing in an insertion direction of the substrate to form the mounting position and causing the substrate to be removably mounted thereon;

an upper guide rail having an upper guide groove provided from a substrate insertion port of said electronic circuit unit frame to the vicinity of the mounting position and provided in an upper face portion of said electronic circuit unit frame;

a lower guide rail having a lower guide groove portion provided from the substrate insertion port to the vicinity of the mounting position and provided in a bottom face portion of said electronic circuit unit frame; and an energizing means for energizing one of said upper and lower guide rails toward the other, wherein one of said upper and lower guide rails which is energized by said energizing means is supported vertically movably on said electronic circuit unit frame and formed movably together with a groove side wall of the guide groove laterally supporting an edge portion of the substrate and said upper and lower guide rails are provided to have a predetermined distance with the connecting portion.

8. The substrate mounting apparatus according to claim 7, wherein said upper guide rail is supported on the upper face portion of said electronic circuit unit frame to be movable toward said lower guide rail side in a lower part, said lower guide rail is fixed to the bottom face portion of said electronic circuit unit frame, and said energizing means is a first spring member engaged with said upper guide rail and the upper face portion for energizing said upper guide rail toward said lower guide rail side.

9. The substrate mounting apparatus according to claim 8, wherein said upper guide rail has one of front and rear ends supported rotatably on the upper face portion of said electronic circuit unit frame and the other formed arcuately movably toward the lower guide rail side.

10. The substrate mounting apparatus according to claim 7, wherein said upper guide rail is fixed to the upper face portion of said electronic circuit unit frame, said lower guide rail is supported on the bottom face portion of the electronic circuit unit frame movably toward the upper guide rail side in an upper part, and said energizing means is a second spring member engaged with said lower guide rail and the bottom face portion for energizing said lower guide rail toward the upper guide rail side.

11. The substrate mounting apparatus according to claim 10, wherein said lower guide rail has one of front and rear ends supported rotatably on the bottom face portion of said electronic circuit unit frame and the other formed arcuately movably toward the upper guide rail side.

12. The substrate mounting apparatus according to claim 7, wherein the upper guide groove of said upper guide rail is opened on a substrate insertion port side of said electronic circuit unit frame and a lower side, the lower guide groove of said lower guide rail is opened on the substrate insertion port side and an upper side, and the upper and lower guide grooves are provided with a slant portion such that the substrate insertion port side is widened.

* * * * *